(12) United States Patent
Skovenborg et al.

(10) Patent No.: US 9,559,650 B1
(45) Date of Patent: Jan. 31, 2017

(54) LOUDNESS LIMITER

(71) Applicant: The TC Group A/S, Risskov (DK)

(72) Inventors: Esben Skovenborg, Arhus (DK); Lars Arknæs-Pedersen, Viby J (DK)

(73) Assignee: MUSIC GROUP IP LTD., Tortola (VG)

( * ) Notice: Subject to any disclaimer, the term of this patent is extended or adjusted under 35 U.S.C. 154(b) by 497 days.

(21) Appl. No.: 13/942,161

(22) Filed: Jul. 15, 2013

Related U.S. Application Data

(60) Provisional application No. 61/671,176, filed on Jul. 13, 2012.

(51) Int. Cl.
*H03G 3/00* (2006.01)
*H03G 3/20* (2006.01)

(52) U.S. Cl.
CPC ...................................... *H03G 3/20* (2013.01)

(58) Field of Classification Search
CPC ........... H04R 3/00; H04R 3/007; H04R 3/002; H04R 29/001; H04R 29/003; H04R 2430/01; H03F 1/30; H03F 1/52; H03F 2200/331; H03F 2200/03; H03G 11/00; H03G 11/008; H03G 11/02; H03G 11/04; H03G 3/20; H03G 5/00; H03G 5/005; H03G 5/025; H03G 5/04; H03G 5/14; H03G 3/00; H03G 7/00; H03G 3/3005; H03G 3/3089; H04S 7/301; H04S 3/00

USPC .... 381/55, 58, 164, 94.9, 94.8, 94.1, 28, 61, 381/119, 120, 121, 103, 102, 101, 100, 381/99, 93, 83, 71.14, 71.12, 71.11, 71.1, 381/317, 318, 320, 104, 106, 107; 700/94; 330/298
See application file for complete search history.

(56) References Cited

U.S. PATENT DOCUMENTS

| 4,887,299 A | * | 12/1989 | Cummins | ............ | H04R 25/356 381/106 |
| 7,848,531 B1 | * | 12/2010 | Vickers | .................. | H03G 7/002 381/107 |
| 2006/0274904 A1 | * | 12/2006 | Lashkari | ............... | H03F 1/3264 381/59 |
| 2009/0116664 A1 | * | 5/2009 | Smirnov | .................. | H04R 3/00 381/106 |
| 2013/0272543 A1 | * | 10/2013 | Tracey | ..................... | H03G 3/32 381/107 |

* cited by examiner

*Primary Examiner* — Leshui Zhang
(74) *Attorney, Agent, or Firm* — Cantor Colburn LLP

(57) ABSTRACT

A loudness limiting method for attenuating an input audio signal in order to constrain a resulting loudness level of an output audio signal by a pre-determined threshold loudness level, the method involving determining a time-varying loudness level of the input audio signal by means of a finite-length sliding window, calculating a time-varying attenuation gain in accordance with a pre-determined threshold loudness level, time-delaying the input audio signal, and applying the time-varying attenuation gain to the time-delayed input audio signal resulting in the output audio signal. A loudness signal processor carries out the loudness limiting method and a computer program product enables a computer to carry out the loudness limiting method.

63 Claims, 16 Drawing Sheets a)  *Input:*

*Sliding-window detector:* b)  *Input:*

*Sliding-window detector, partitioned into 3 blocks:* c)  *Input:*

*Sliding-window detector, different, simultaneous window-lengths:*

LOUDNESS LIMITER

CROSS-REFERENCE TO RELATED APPLICATIONS

This application is related to and claims the benefit of U.S. provisional application Ser. No. 61/671,176, filed on 13 Jul. 2012, the contents of which are herein incorporated by reference in their entirety.

FIELD OF THE INVENTION

Disclosed is a signal processor capable of determining and applying a time-varying attenuation gain to an input audio signal, such that an estimated loudness level of the output signal is attenuated/limited according to a given threshold loudness level.

BACKGROUND OF THE INVENTION

In many applications it is desirable to automatically control the level of an audio signal. Traditionally, such an audio signal processor is known as an automatic gain control (AGC), compressor, or limiter. A special type of such signal processors contains a (simple) estimator of loudness level, such that the processor attempts to control the level in a way that corresponds to the perceived loudness of the signal.

The limiters are a common type of audio signal processors. Such pre-existing limiters of audio signals were generally designed to limit signal transients or limit the maximum signal amplitude. Soft-clipping limiters achieve their limiting function in combination with a look-ahead delay, such that a saturating response can be applied—as opposed to a "hard clipping" limiter. However, in either case, such limiters generally operate at a time-scale ranging from single audio samples to a few ms duration. They control a technical property of the signal. Typically the goal of such limiters is for their processing to be "transparent", i.e. near-inaudible. Hence, such limiters are neither suitable for, nor intended for, controlling nor limiting the loudness of the signal.

The auditory system has some properties of loudness perception that are roughly comparable to energy integration, with an order of magnitude of 20-100 ms.

Furthermore, speech (a common type of audio signal) requires a detector with an integration time of at least around 400 ms, in order for the measured level to be fairly steady for speech that is homogeneous (i.e. with constant loudness).

All dynamic range compressors/processors may be categorized as either feed-forward, meaning the side-chain and thus the level-control is based on a level measurement of the input signal. Or feed-back, meaning the side-chain is based on measuring the level of the output signal.

Some pre-existing compressors or AGCs can perform signal attenuation, based on an RMS level detector—which may be considered a primitive loudness level estimator. However, those processors that have been based on a feed-back topology could only indirectly perform the "limiting" function. Because the side-chain is inherently a feedback loop, such a compressor will continually approximate the appropriate attenuation gain value. Hence, it may suffer from "over-shoots", and/or may adapt too slowly to a change of the input signal requiring limiting.

Alternatively, some pre-existing compressors are based on a feed-forward topology. Typically, such processors have performed the (loudness) level estimate in their side-chain based on a short, fixed time-scale and subsequently applied smoothing/low-pass filtering to the control signal. Even though such a design may employ look-ahead delay, it cannot—in the general case—achieve limiting of the output loudness level. The calculation of each attenuation gain value, in pre-existing compressor, would be based on a single output value from its level detector. Furthermore, if a pre-existing dynamic range compressor were to perform a kind of limiting of the loudness level, it would require parameter settings of an infinitely high "ratio" and a very fast "attack". Doing so might cause the processor to severely distort the signal.

Consequently, none of the existing audio processors are capable of combining the "limiting" property with the "loudness control" property. That is, processing the audio such that the loudness level, estimated on a given time-scale, is prevented from exceeding a specified loudness level threshold.

"Loudness limiter" processing has become increasingly relevant in the past decade. In broadcasts in radio/TV and other media, regulations may require that the programme itself—or commercials within/between programmes—must not exceed a certain loudness level, as measured on a specified time-scale. Both international and national standards and recommendations have been published in recent years, specifying and supporting such regulations, by organizations including ITU-R, EBU, ATSC, ARIB, and BCAP. Regulations of maximum loudness levels are also being specified in other areas, such as in the cinema, and for personal mobile audio devices.

The only ways to comply with such regulations have involved measuring, with a loudness meter, the loudness level (at the specified time-scale). If the programme or production in question was found to exceed the specification it would either need to be remixed in post-production, attenuating its loudest passages, and then measured again. That is a time-consuming process and requires an extended work-flow. Or the programme could simply be attenuated in its entirety, according to how much the measurement found necessary; however this is also undesirable, because of the overall loudness of the program would consequently also be attenuated—quite unnecessarily.

SUMMARY OF THE INVENTION

A loudness limiting method is disclosed for attenuating an input audio signal in order to constrain a resulting loudness level of an output audio signal by a pre-determined threshold loudness level, said loudness limiting method comprising the steps of
  determining a time-varying level of said input audio signal by means of a finite-length sliding window;
  calculating a time-varying attenuation gain on the basis of said time-varying level of said input audio signal and said pre-determined threshold loudness level;
  time-delaying said input audio signal; and
  applying said time-varying attenuation gain to said time-delayed input audio signal resulting in said output audio signal.

According to the disclosure, a pre-determined threshold loudness level is a maximum level by which the resulting loudness level of the output signal is limited or constrained.

According to the disclosure, a loudness level is based on a calculation typically as a means of estimating the perceived loudness level of the signal.

According to an embodiment of the disclosure, the more the estimated output loudness level would have exceeded the threshold loudness level, the larger the time-varying attenuation gain.

According to an embodiment of the disclosure, the finite-length sliding window 'slides' (advances) by steps of one audio sample.

According to an embodiment of the disclosure, the finite-length sliding window 'slides' by a step corresponding to a number of audio samples, determined such that the effective time-resolution is still sufficiently high to achieve an attenuation gain sufficiently precise.

According to an embodiment of the disclosure, the finite-length sliding window may be a FIR filter. For example, prior art level detectors based on IIR-filters do not provide a finite-length sliding-window detector. However, a sliding-window detector can according to the disclosure be based on an IIR-filter, for example by collecting the output values from the filter in a circular buffer. Alternatively, the FIR filter in a sliding-window detector, could be designed as having a truncated IIR response.

According to one embodiment, the threshold loudness level is specified on an absolute scale, such as dBFS. In another embodiment, the threshold level is specified relative (e.g. in dB) to a given reference level, or relative to a measured overall (loudness) level of the signal itself.

By constraining the loudness level of the resulting output signal, the disclosure may be employed to process a broadcast programme, and hence ensure that the programme complies with standards, recommendations or guidelines that specify a maximum loudness on a certain time-scale. Post-processing as well as transmission applications may benefit from having the loudness limiter inserted into the signal chain.

The loudness limiter may be used in real-time or "live" processing applications as well as in connection with file-based processing, where the signal processing itself may be performed faster than real-time.

Alternative applications of the loudness limiter include other digital audio players or personal media players. In such applications it may be attractive to have the loudness level constrained by the loudness limiter, such that the loudness level—on one or more time-scales—does not exceed a certain maximum level. This is particularly useful as such audio/media players typically combine songs/tracks mixed and mastered at very different levels. In this respect, the loudness limiter could furthermore be considered a means of reducing possible hearing damage.

Another alternative application of the loudness limiter includes processing of the sound for films shown in a cinema. Constraining the loudness level of the movie, possibly on several time-scales, may prevent or reduce complaints from the audience in the movie theatre due to sounds that were perceived as annoyingly loud. In this application, the audio track(s) of the entire movie may be processed by the loudness limiter in non-realtime (i.e. faster than realtime) prior to showing the movie. Or the playback system in the cinema might incorporate a loudness limiter, thus processing the audio tracks in real-time during (i.e. immediately before) playback.

Whereas in an embodiment of the disclosure, the method is performed in one apparatus, processor or device, the carrying out of the loudness limiting method may in an alternative embodiment of the disclosure be distributed to two or more physical devices, so that e.g. the steps up to and including the calculation of a time-varying attenuation gain is performed by one device, and the applying of the attenuation gain to the delayed input signal is performed by another device, possibly asynchronously, possibly even at two completely different times and/or locations.

It is noted, that the steps of the disclosure may be performed in a different order than mentioned above, possibly together with additional steps, or one or more of the steps may be repeated in embodiments of the disclosure.

An advantageous embodiment of the disclosure is obtained when said calculating a time-varying attenuation gain comprises repetitively calculating an individual attenuation gain value based on several time-varying level values of said determined time-varying level of said input audio signal, said several time-varying level values being determined for different times of said time-varying level of said input audio signal.

According to an embodiment of the disclosure, several successive values of the input signal level, preferably estimated as the input signal loudness level, are used for calculating each attenuation gain value. Hence, the attenuation gain applied to a certain input signal sample is based on a broader view of the loudness level and not only on the most recent, window of input signal samples.

It is noted that according to different embodiments of the present disclosure, the input signal, the time-varying level, the attenuation gain, the delayed signal and the output signal may be processed at different sample rates. For example, in an embodiment of the disclosure, a downsampling of the input signal is made in a preprocessing step and/or in relation to determining the time-varying signal level in order to reduce the processing requirements of the level detection and the attenuation gain calculation. The time-varying attenuation gain may be up-sampled again, e.g. in a smoothing step, to fit the delayed input signal, or the individual gain values from the slow gain signal may simply be held for a relevant number of samples of the fast delayed input signal. Other embodiments comprising further or other steps of down- or up-sampling are also within the scope of the present disclosure.

In accordance with the above, when the present text refers to individual or specific values or samples of a signal, or e.g. that a specific gain value corresponds to a specific input signal value, this is understood broadly with the relevant sample rate and timing conversions to be applied in accordance with the specific embodiment. In the following is for the sake of simplicity typically referred to an embodiment without down- or upsampling, where an individual signal level value and an individual attenuation gain value is determined for each sample of the input signal, and where each individual attenuation gain value is applied the, now delayed, corresponding individual input signal sample to establish an individual output signal sample. For use in embodiments with downsampling, an individual attenuation gain value will typically correspond to and should thus be applied to several consecutive input signal values, or be up-sampled to establish a corresponding number of attenuation gain values. The person skilled in the relevant art of digital signal processing knows well how to manage the timing in systems with downsampled side chain processing.

In particular, when in an embodiment of the disclosure there is said to be repetitively calculated an individual attenuation gain value based on several time-varying level values of said determined time-varying level of said input audio signal, then it is directly usable for an embodiment without downsampling, but in a system where the attenuation gain rate is lower than the time-varying level rate, i.e. having a several time-varying level values per attenuation gain value, the above wording means that each gain value is based on several of these several time-varying level values, i.e. as if there was no downsampling.

An advantageous embodiment of the disclosure is obtained when an individual attenuation gain value is associated with a specific time of said input audio signal, and wherein several time-varying level values forming basis for the individual attenuation gain value comprise substantially all time-varying level values determined where an input signal value for said specific time of said input audio signal is within said finite-length sliding window.

The input level values, preferably loudness level values, are according to the disclosure determined by means of a finite-length sliding window. In an advantageous embodiment, the specific attenuation gain value that is going to be used to attenuate a specific input signal sample is calculated based on not only the most recent loudness level, but on all the loudness level values that were estimated while the sliding window contained the specific input signal sample, i.e. both past and future loudness estimations incorporating that sample. In other words, all signal level estimations that were influenced by a specific input signal sample are used when calculating the attenuation gain for that specific sample. This is a very advantageous embodiment, as it takes into account how a sample will affect future loudness level estimates and thereby enables calculation of an attenuation gain that certainly will make the output loudness level conform to the requirements defined by the threshold. The 'future' level values are accessible due to the time-delaying of the input signal.

An advantageous embodiment of the disclosure is obtained when, when determining each of said several time-varying level values forming basis for an individual attenuation gain value associated with a specific time of said input audio signal, the finite-length sliding window includes an input signal value for said specific time of said input audio signal.

In other words, by an embodiment of the present disclosure the sliding window includes the specific input signal sample as long as signal level values to be used in the calculation of an attenuation gain for that specific sample are being determined.

Again is referred to the above statement about downsampling and in particular mentioned that when an individual attenuation gain value is associated with a specific time of said input audio signal this applies directly to an embodiment without downsampling, whereas the person skilled in the art knows that with a downsampled side chain result, in this case the attenuation gain signal, each individual attenuation gain value is associated with several samples of the input signal, i.e. several specific times of the input signal, or in other words one specific, but coarse, time of the input signal, covering several samples.

An advantageous embodiment of the disclosure is obtained when said different times, for which the several time-varying level values forming basis for said individual attenuation gain value are determined, are within a time interval corresponding to a length of said finite-length sliding window.

In an embodiment several signal level values, preferably loudness level values, are used for calculating each attenuation gain value, and the specific loudness level values to use for a specific attenuation gain are preferably those loudness level values estimated for a time interval corresponding to the length of the sliding window, as the length of the sliding window determines for how many times a specific input signal sample will influence loudness level estimations. By incorporating loudness level values distributed along the window length, preferably all loudness level values estimated within the window length, in the calculation of each attenuation gain value is facilitated that all influence from a specific input sample can be taken into account when calculating a corresponding attenuation gain value.

An advantageous embodiment of the disclosure is obtained when an individual attenuation gain value of said time-varying attenuation gain is based on a part of said input audio signal, the length of said part corresponding to substantially twice the length of the finite-length sliding window.

According to a preferred embodiment of the disclosure, input signal samples from a time interval of substantially twice the length of the sliding window are used when calculating an attenuation gain value to be applied to a specific input signal sample, typically in the centre of that time interval. More precisely, the time interval is actually preferably (2*window length)−1, as in a preferred embodiment the sliding window for the first level estimation that affects the specific attenuation gain overlaps by one sample or chunk the sliding window for the last level estimation used in the calculation. For relatively large window lengths preferably used according to the present disclosure, the actual time interval of (2*window length)−1 and other similar time intervals are considered within the scope of the present disclosure by the term substantially twice the length of the finite-length sliding window. In a preferred embodiment of the disclosure, the input signal time interval affecting a particular output signal sample becomes substantially two window lengths because the attenuation gain is preferably based on loudness level estimations distributed over one window length, and the earliest of these loudness level estimations is itself based on analysis, e.g. RMS calculation, going further one window length back in time, hence resulting in two window lengths overlapping by one sample or one chunk of samples. The sample or chunk at which the two window lengths overlap, i.e. the middle sample of the input signal time interval used to calculate the particular attenuation gain, is the input signal sample that is delayed by approximately one window length and applied to the then calculated particular attenuation gain to create a corresponding output sample thereby possibly attenuated under consideration of the loudness level to both sides of the sample.

It is again noted that in an embodiment involving downsampling the person skilled in the art will know to implement the necessary modifications, in the present case this involves in particular that the window length relates to in input signal in terms of time but not necessarily in terms of the number of samples.

An advantageous embodiment of the disclosure is obtained when the determining the time-varying level of said input audio signal comprises estimating a time-varying loudness level of said input audio signal.

Estimating a loudness level of the input audio signal facilitates determining the difference between the estimated loudness level of the input signal and the threshold loudness level directly, such that the attenuation gain is determined based on this difference.

An advantageous embodiment of the disclosure is obtained when an estimated loudness level over a single finite-length window of the output audio signal substantially never exceeds said pre-determined threshold loudness level.

According to this preferred embodiment the attenuation gain is determined such that the output signal within a given window is attenuated precisely enough for its loudness level to meet, but never exceed, the threshold. Thus a "brick-wall" type of loudness limiting is enabled. In case the loudness level over a single window does not exceed the given threshold, the attenuation gain is set so that the input signal is effectively 'bypassed' to output signal.

According to a further embodiment the attenuation gain is determined such that the output signal does not exceed the threshold, within a certain tolerance. This kind of limiting may be sufficient to comply with some regulations. An example of a tolerance could be +/−0.5 dB.

An advantageous embodiment of the disclosure is obtained when the finite-length sliding window is partitioned into blocks, and said time-varying attenuation gain is calculated based on the partition blocks of said finite-length sliding window.

An advantageous embodiment of the disclosure is obtained when the finite-length sliding window is partitioned such that each window consists of exactly one partition block.

Each detector window contributes with exactly one attenuation gain value which applies to the samples covered by the window—unless that value is "overridden" by a (larger) attenuation gain value from another, overlapping, window.

An advantageous embodiment of the disclosure is obtained when the finite-length sliding window is partitioned such that each window consists of more than one partition block, such that the attenuation gain may be distributed according to the relative levels of the partition blocks within each window.

The attenuation gain may be distributed among the partition blocks within each window such that blocks with the higher levels are attenuated more than blocks with lower levels. However, the attenuation is calculated such that the loudness level over the window as a whole matches the threshold loudness level. In principle, the partition blocks can be arbitrarily small; for example, the extent of a partition block can correspond to a single period of the lowest frequency of the input audio signal.

An advantageous embodiment of the disclosure is obtained when the time-varying attenuation gain is distributed in proportion to relative levels of the partition blocks within each finite-length sliding window.

An advantageous embodiment of the disclosure is obtained when multiple window-lengths are employed simultaneously, by applying an attenuation that is a combination of the partition blocks, from the different windows, corresponding to the same input sample(s), such that said estimated loudness level of the output signal is limited at multiple time-scales simultaneously This embodiment is advantageous by applying the attenuation based on the partition block which contributes with the largest attenuation, chosen among the blocks from the different windows where the blocks are aligned in time.

An advantageous embodiment of the disclosure is obtained when operating at multiple simultaneous time-scales, and each time-scale comprising an individual threshold loudness level.

The individual threshold levels may be given such that the estimated loudness level corresponding to a shorter time-scale is permitted to be higher than the level corresponding to a longer time-scale. Thus, a "shorter" sound may have an output loudness level which is higher than the output loudness level of a "longer" sound, even though both were attenuated.

An advantageous embodiment of the disclosure is obtained when said determining said time-varying level of said input audio signal comprises an RMS calculation of the input audio signal.

According to an embodiment of the disclosure the sliding window detector may perform an RMS calculation of the input signal, where the energy within each window can be calculated as the sum of squared samples contained within the window. In this case the loudness threshold level corresponds to a maximum energy within each window, such that the signal is attenuated via detector windows whose energy surpasses this maximum energy.

According to a further embodiment of the disclosure the sliding window detector may be implemented by means of an FIR filter, where the filter order (n) is equal to the detector window length, and the filter coefficients are all set to 1/n. The input samples of the filter are squared and the square root is applied to the output samples of the filter.

According to a further embodiment of the disclosure the sliding window detector may be implemented by means of an IIR filter, where the time-constant of the filter is smaller than or equal to the time-constant of an IIR filter by which the resulting output signal may be judged, and where 2 or more output values of the IIR filter(s) are stored in the sliding window corresponding to different times or different IIR filters; where the gain allotter determines the attenuation gain based on the values in the sliding window. The input samples of the IIR filter are squared and the square root is applied to the output samples of the filter.

An advantageous embodiment of the disclosure is obtained when said determining said time-varying level of said input audio signal is based on a filtering related to a measurement filtering according to specifications for the use of the output signal. For example where the resulting loudness level of the output signal is to be measured using a recursive (IIR) filter, the sliding window detector is hence also preferably based on a recursive filter.

An advantageous embodiment of the disclosure is obtained when said determining said time-varying level of said input audio signal is based on a recursive filter.

An advantageous embodiment of the disclosure is obtained when said input audio signal is received from the output of a dynamic-range compressor. Thereby the loudness limiter of the present disclosure can effectively limit the signal when attenuation by the prior art dynamic-range compressor would not be sufficient, respective to the threshold loudness level.

An advantageous embodiment of the disclosure is obtained when comprising a step of pre-processing said input audio signal prior to said determining said time-varying level of said input audio signal.

According to a embodiment of the disclosure the input signal is processed by a signal preprocessor prior to said sliding window detector, such that the preprocessor and the sliding window detector together perform a superior estimate of a time-varying loudness level of the input signal.

A signal preprocessor may according to an embodiment of the disclosure improve the accuracy of the time-varying loudness level estimated by the sliding window detector, by implementing (simple) models of one or more known properties of loudness perception.

According to a further embodiment of the disclosure, the preprocessor may comprise loudness models containing multi-band processing. For instance, the signal could be analyzed in terms of octave-bands, ⅓-octave bands, or "critical bands" known from psychoacoustic models.

An advantageous embodiment of the disclosure is obtained when said pre-processing comprises frequency weighting, preferably by means of a filter applied to the input audio signal.

A frequency weighting may preferably be based on the frequency-dependent loudness sensitivity of the auditory system (i.e. equal loudness contours).

An advantageous embodiment of the disclosure is obtained when said pre-processing comprises applying an A-weighting or C-weighting filter.

The A-weighting or C-weighting filter is preferably applied when a short-term Leq, as in an acoustical measurement, is intended to be limited.

An advantageous embodiment of the disclosure is obtained when said pre-processing comprises applying a K-weighting filter.

Preferably, a K-weighting filter is applied when the input is an audio signal measured 'electrically' (rather than acoustically), such as a broadcast programme.

An advantageous embodiment of the disclosure is obtained when said pre-processing comprises a channel weighting, preferably by combining a multi-channel input audio signal into a single-channel preprocessed signal.

Where the audio input signal consists of multiple audio channels, those channels are in an embodiment of the disclosure combined to form a single preprocessed signal feeding the sliding window detector and thus leading to a single time-varying loudness level, rather than one time-varying loudness level per input channel.

An advantageous embodiment of the disclosure is obtained when said channel weighting comprises a per-sample power domain sum of channels of said input audio signal.

For example, the channel weighting may be implemented by a power sum of the 'left' and 'right' channels, in case of a stereo input signal.

An advantageous embodiment of the disclosure is obtained when said channel weighting comprises a gain matrix containing a gain coefficient for each individual channel of the input audio signal.

The preprocessor may in an embodiment of the disclosure apply channel weighting such that the channels of a multi-channel input signal (e.g. a 5.1 surround signal) would be weighted by individual gain factors.

An advantageous embodiment of the disclosure is obtained when said pre-processing comprises a level normalization of the input signal. In an embodiment of the disclosure this may be obtained by applying a gain value which is constant or which is adapted slowly compared to the gain applied by the loudness limiter itself.

An advantageous embodiment of the disclosure is obtained when comprising a step of smoothing said time-varying attenuation gain, such that abrupt changes of said attenuation gain would not cause distortion of the output audio signal.

In an embodiment of the disclosure, a smoothing filter is applied, such as a low-pass filter, to the time-varying attenuation gain. Thereby abrupt changes of the gain value that may occur, especially when operating at short time-scales, would be prevented from causing distortion of the output signal.

According to a preferred embodiment, the smoothing filter is designed such that it does not 'smooth' the signal so much that it would prevent the loudness limiter from effectively limiting the output loudness level.

The present disclosure further relates to a loudness signal processor for attenuating an input audio signal in order to constrain a resulting loudness level of an output audio signal by a pre-determined threshold loudness level, the loudness signal processor comprising an input audio signal;
a level detector block arranged to determine a time-varying level of said input audio signal by means of a finite-length sliding window;
a gain allotter arranged to calculate a time-varying attenuation gain on the basis of said time-varying level of said input audio signal and said pre-determined threshold loudness level;
a time-delay block arranged to delay the input audio signal;
an attenuator block arranged to apply said time-varying attenuation gain to the delayed input audio signal, resulting in said output audio signal.

An advantageous embodiment of the disclosure is obtained when said level detector block comprises a sliding-window detector block.

An advantageous embodiment of the disclosure is obtained when said time-varying attenuation gain comprises a plurality of individual attenuation gain values, an attenuation gain value being based on several time-varying level values of said determined time-varying level of said input audio signal, said several time-varying level values being determined for different times of said time-varying level of said input audio signal.

An advantageous embodiment of the disclosure is obtained when said time-varying attenuation gain comprises a plurality of individual attenuation gain values, wherein an individual attenuation gain value is associated with a specific time of said input audio signal, and wherein the several time-varying level values forming basis for the individual attenuation gain value comprises substantially all time-varying level values determined where an input signal value for said specific time of said input audio signal is within said finite-length sliding window.

An advantageous embodiment of the disclosure is obtained when, when determining each of said several time-varying level values forming basis for an individual attenuation gain value associated with a specific time of said input audio signal, the finite-length sliding window includes an input signal value for said specific time of said input audio signal.

An advantageous embodiment of the disclosure is obtained when said different times, for which the several time-varying level values forming basis for said individual attenuation gain value are determined, are within a time interval corresponding to a length of said finite-length sliding window.

An advantageous embodiment of the disclosure is obtained when an individual attenuation gain value of said time-varying attenuation gain is based on a part of said input audio signal, the length of said part corresponding to substantially twice the length of the finite-length sliding window.

An advantageous embodiment of the disclosure is obtained when the time-varying level of said input audio signal corresponds to an estimate of a time-varying loudness level of said input audio signal.

An advantageous embodiment of the disclosure is obtained when an estimated loudness level over a single finite-length window of the output audio signal substantially never exceeds said pre-determined threshold loudness level.

An advantageous embodiment of the disclosure is obtained when the finite-length sliding window is partitioned into blocks, and said gain allotter is arranged to calculate said time-varying attenuation gain based on the partition blocks of said finite-length sliding window.

An advantageous embodiment of the disclosure is obtained when the finite-length sliding window is partitioned such that each window consists of exactly one partition block.

An advantageous embodiment of the disclosure is obtained when the finite-length sliding window is partitioned such that each window consists of more than one partition block, and the gain allotter is arranged to enable distribution of the time-varying attenuation gain according to the relative levels of the partition blocks within each window.

An advantageous embodiment of the disclosure is obtained when the gain allotter is arranged to distribute the time-varying attenuation gain in proportion to relative levels of the partition blocks within each finite-length sliding window.

An advantageous embodiment of the disclosure is obtained when the loudness signal processor is arranged to employ multiple window-lengths simultaneously, by applying an attenuation that is a combination of the partition blocks, from the different windows, corresponding to the same input sample(s), such that said estimated loudness level of the output signal is limited at multiple time-scales simultaneously An advantageous embodiment of the disclosure is obtained when arranged to employ multiple simultaneous time-scales, each time-scale comprising an individual threshold loudness level.

An advantageous embodiment of the disclosure is obtained when said level detector block is arranged to determine said time-varying level of said input audio signal by performing RMS calculation of the input audio signal.

An advantageous embodiment of the disclosure is obtained when comprising a preprocessor arranged to pre-process said input audio signal prior to said level detector block.

An advantageous embodiment of the disclosure is obtained when said preprocessor comprises frequency weighting, preferably a filter applied to the input audio signal.

An advantageous embodiment of the disclosure is obtained when said preprocessor comprises an A-weighting or C-weighting filter.

An advantageous embodiment of the disclosure is obtained when said preprocessor comprises a K-weighting filter.

An advantageous embodiment of the disclosure is obtained when said pre-processor comprises channel weighting, preferably by being arranged to combine a multi-channel input audio signal into a single-channel preprocessed signal.

An advantageous embodiment of the disclosure is obtained when said channel weighting comprises a per-sample power domain sum of channels of said input audio signal.

An advantageous embodiment of the disclosure is obtained when said channel weighting comprises a gain matrix containing a gain coefficient for each individual channel of the input audio signal.

An advantageous embodiment of the disclosure is obtained when comprising smoothing filter arranged to smooth said time-varying attenuation gain such that abrupt changes of said attenuation gain would not cause distortion of the output audio signal.

The present disclosure further relates to a computer program product comprising computer-executable instructions which when performed by a computer or other data processor comprising a processor, memory, audio signal input and audio signal output, attenuates an input audio signal in order to constrain a resulting loudness level of an output audio signal by a pre-determined threshold loudness level; the computer-executable instructions comprising
  computer-executable instructions for determining a time-varying level of said input audio signal by means of a finite-length sliding window;
  computer-executable instructions for calculating a time-varying attenuation gain on the basis of said time-varying level of said input audio signal and said pre-determined threshold loudness level;
  computer-executable instructions for time-delaying said input audio signal; and
  computer-executable instructions for applying said time-varying attenuation gain to said time-delayed input audio signal resulting in said output audio signal.

An advantageous embodiment of the disclosure is obtained when comprising computer-executable instructions for performing the loudness limiting method according to any of the above.

The present disclosure further relates to a loudness limiting method for attenuating an input audio signal in order to constrain a resulting loudness level of an output audio signal by a pre-determined threshold loudness level, said loudness limiting method comprising the steps of
  determining a time-varying level of said input audio signal by determining a plurality of time-varying level values;
  calculating a time-varying attenuation gain where an individual attenuation gain value of the time-varying attenuation gain is based on at least two of said plurality of time-varying level values of said input audio signal and said pre-determined threshold loudness level;
  time-delaying said input audio signal; and
  applying said time-varying attenuation gain to said time-delayed input audio signal resulting in said output audio signal.

The at least two time-varying level values used to determine a time-varying attenuation gain value may be determined for different times of the input audio signal and/or be determined by different methods or with different window lengths for the same time of the input audio signal. It is noted, that the embodiment described here may within the scope of the disclosure be combined with any of the other embodiments described elsewhere in the present disclosure, or be enhanced with features thereof. Further, the steps of the disclosure may be performed in a different order than mentioned above, possibly together with additional steps, or one or more of the steps may be repeated in embodiments of the disclosure.

The at least two time-varying level values may further correspond to one or more time-varying level values obtained by integrating or otherwise retaining influence of past time-varying level values, and one or more time-varying level values obtained by determining a current input audio signal level according to any suitable method. Thereby the determining of time-varying level values may e.g. be performed by an IIR filter maintaining a state based on past values, and calculating a new level based on the input audio signal current amplitude. The gain allotter in calculating the time-varying attenuation gain then receives both a time-varying level value being the state reflecting the past and a time-varying level value based on the current input audio signal amplitude.

The disclosure further relates to a loudness limiting method for attenuating an input audio signal in order to constrain a resulting loudness level of an output audio signal by a pre-determined threshold loudness level, the loudness limiting method including the steps of calculating a time-varying level on the basis of said input audio signal;

calculating a time-varying attenuation gain on the basis of said time-varying level and said pre-determined threshold loudness level;

time-delaying said input audio signal; and applying said time-varying attenuation gain to said time-delayed input audio signal resulting in said output audio signal.

It is noted, that the steps of the disclosure may be performed in a different order than mentioned above, possibly together with additional steps, or one or more of the steps may be repeated in embodiments of the disclosure. In an embodiment, the calculation of a time-varying level and time-varying attenuation gain is iterative or conditionally repeated, in order to for example iteratively approach an optimum or at least better attenuation gain, or to first establish an attenuation gain based on primary criteria, e.g. the loudness threshold, and then try to optimize it according to secondary considerations such as for example smoothness, audibility of gain changes, distortion, etc. In an embodiment of the disclosure the calculation of attenuation gain by the Gain allotter may for example use a max-function, e.g. as described in more detail with reference to FIG. 2, in one calculation of attenuation gain in order to achieve a certain brickwall limiting loudness control, and, before and/or after that, in a number of further iterations of the calculation of attenuation gain step the Gain allotter may optimize the attenuation gain by a different, possibly iterative method, e.g. utilize output level prediction as for example described with reference to FIG. 15, e.g. in order to improve on secondary criteria, or to ensure compliance with a particular specification. As seen by this example, the embodiment described here may within the scope of the disclosure be combined with any of the other embodiments described elsewhere in the present disclosure, or be enhanced with features thereof.

An advantageous embodiment is obtained when said calculating a time-varying attenuation gain comprises repetitively calculating an individual attenuation gain value based on a plurality of time-varying level values of said calculated time-varying level.

An advantageous embodiment is obtained when said time-varying level calculated on the basis of said input audio signal comprises a time-varying predicted level of said output signal.

The calculation of a predicted level of the output signal is preferably performed by a "measuring method" similar to the one that would be used to measure if the output signal complies with specifications. Hence, if for example the relevant specifications refer to an IIR filter, the prediction should preferably be calculated by a similar IIR filter.

An advantageous embodiment is obtained when said calculating a time-varying attenuation gain is based on a level of said input signal and said time-varying predicted level of said output signal, as well as said pre-determined threshold loudness level.

An advantageous embodiment is obtained when said calculating a time-varying predicted level of said output audio signal is based on a level of said input signal and a representation of past levels of said output audio signal.

An advantageous embodiment is obtained when said representation of past levels of said output audio signal is a state of an IIR filter, and wherein said state is updated in relation to said calculated time-varying attenuation gain.

In order to maintain a state of past output signal levels to be able to predict measurements on the output signal, the Level Predictor performing the calculating of predicted levels may receive the attenuation gain calculated by the Gain Allotter for the current input signal value, and thereby be able to calculate the output signal value established by the Attenuator applying the attenuation gain to the time-delayed input audio signal.

In a preferred embodiment of the disclosure, the Gain Allotter does not affect the input audio signal, i.e. attenuation gain of 1.0, unless the predicted level is above the threshold, in which case the attenuation gain is calculated to produce an output level of exactly the threshold value. In such an embodiment, instead of receiving the calculated attenuation gain and calculate a resulting output signal value, the Level Predictor may simply just use the input signal value of no limitation were made, or else simply use the threshold value as output signal value. The Level Predictor may have access to the threshold value to be able to determine this, or may just receive the output signal value, as either the input signal value or the threshold value, from the Gain Allotter, instead of the calculated attenuation gain.

An advantageous embodiment is obtained when one or more of the steps are iterated to optimize the calculated time-varying attenuation gain. In an embodiment of the disclosure, the calculation of attenuation gain and preferably also the level calculation or prediction are iterated to optimize the attenuation gain, e.g. in order to better consider secondary criteria besides the loudness level itself. The level calculation and/or attenuation gain calculation may be performed with same or different algorithms in each iteration. The step of delaying the input signal should preferably also be iterated in order to synchronize the input signal with the attenuation gain from the side chain, or the accumulated delay may be determined and applied in one execution of the step of delaying. A detailed example of an embodiment with iterative optimization is described with reference to FIG. 15-18.

BRIEF DESCRIPTION OF THE DRAWINGS

The disclosure is described in more detail on the basis of the following figures. The examples of embodiments shown are to be understood as examples, and are not designed to limit the disclosure to the features shown. Here.

DETAILED DESCRIPTION OF THE DRAWINGS

The present disclosure constitutes a loudness limiter. It comprises an audio signal processor which can attenuate the audio signal such that the time-varying loudness level, estimated from the signal, does not exceed a specified loudness threshold. When the loudness level of the input signal does not exceed the threshold, the loudness limiter does not alter the signal.

Figure 1:
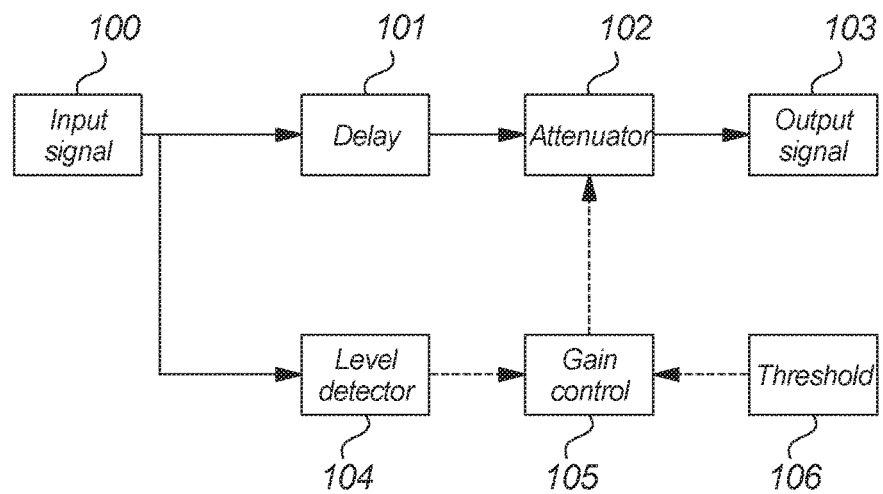
FIG. 1 shows a signal processor performing dynamic range compression or limiting, according to prior art.

FIG. 1 shows a block diagram of a typical prior art dynamic-range compressor. In Zölzer's "DAFx—Digital Audio Effects" (Wiley, 2011) the technical details of several variations of such processors are provided. In FIG. 1 the Level detector block (104) may implement a first-order IIR-based RMS measurement (Zölzer, FIG. 4.10). The Delay block (101) provides so-called look-ahead delay, which serves to time-align the audio signal with the control signal from the side-chain. The Gain control block (105) calculates each attenuation gain value, based on an output from the Level detector (104) and the given threshold level (106). In case of a limiter, the Gain control would simply calculate attenuation_gain=input_level−threshold_level. The Attenuator block (102) then multiplies the signal amplitude with the attenuation gain.

Figure 2:
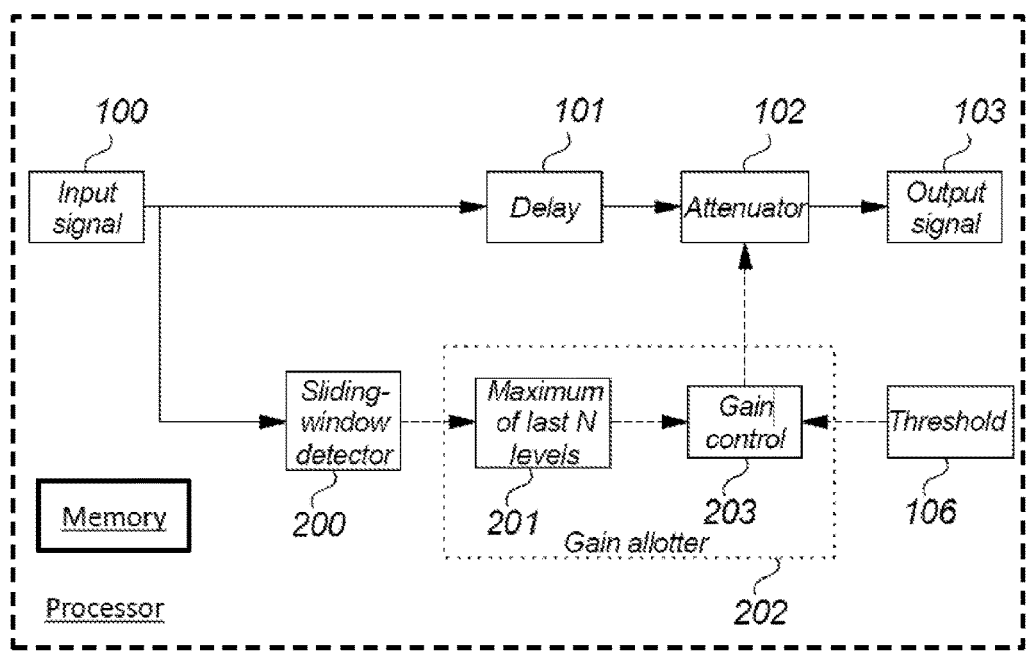
FIG. 2 shows an embodiment of the present disclosure.

FIG. 2 shows an embodiment of the present disclosure. Besides an Input signal (100), a Delay block (101) providing look-ahead delay to time-align the audio signal with the control signal from the side-chain, an Attenuator (102) multiplying the delayed input signal amplitude with an attenuation gain received from a side chain based on, among other things, the Input signal (100) and a Threshold level (106) to provide an Output signal (103), the illustrated embodiment of the present disclosure further comprises a Sliding-window detector block (200), and a Gain allotter block (202) comprising a Maximum-function block (201) and a Gain control block (203). The solid line connections indicate audio signals, whereas dashed line connections indicates control signals, which may optionally be down-sampled compared to the audio signal rate, or parameters.

The Sliding-window detector block (200) may be considered a special kind of level detector, based on a finite-length analysis window or FIR filter. The length of the detector's window—or, equivalently, the order of the FIR filter—determines the time-scale at which the loudness level can be limited by the processor. The Delay time (101) is then typically as long as the analysis window; hence the signal processor is a causal system.

The Sliding-window detector (200) may additionally perform an implicit down-sampling of its output, such that subsequent blocks run at a lower rate than the audio sample rate.

In an advanced, further embodiment the FIR-type level detector could comprise a truncated IIR filter.

The present disclosure typically operates at timescales of 200 ms to 3 s, which are determined according to the perceptual loudness property that should be limited. In comparison, pre-existing limiters operate at time-scales 100 s or 1000 s times longer.

A Gain allotter block (202) is characteristic of the present disclosure. The Gain allotter bases its calculation of each attenuation gain value on a set of levels, which in the embodiment of FIG. 2 is provided by the sliding window detector. This is different from the prior art, such as the Gain control block (105), that only takes a single output from the Level detector (104) into account when calculating an attenuation gain value.

In the embodiment in FIG. 2, the Gain Allotter consists of first calculating the maximum of the last N levels in block (201) from the Sliding-window detector (200). Here, N is the window length, in samples (possibly at a down-sampled rate). Then the Gain Allotter by a Gain control block (203) calculates the attenuation gain such that the audio samples corresponding in time to the samples "covered by" the detector window are attenuated by as much as the window exceeds the threshold level (if at all), received from Threshold block (106).

In alternative embodiments of the disclosure, the Gain allotter (202) may analyse the last N levels of the Sliding-window detector by means of more advanced function than a simple maximum function described above, either in order to smooth the possible hard edges of a true maximum function, or in order to meet other constraints than just the loudness threshold, thus making it possible to optimize the loudness limiter to certain applications. For the simple smoothing, a so-called soft maximum function utilising exp and log functions can be used in an embodiment of the disclosure. For more advanced purposes, the analysis may incorporate taking prior and subsequent attenuation gains into account in order to shape how the attenuation evolves over time. In other words: in general, multiple different attenuation gain curves exist, all of which will limit the resulting loudness level according to the threshold. Hence, a secondary constraint can be employed in addition to the "limiting" constraint, for example a) minimizing the local variance in the attenuation gain curve, b) constraining the maximum attenuation gain increase and decrease rates, c) constraining the gain rates asymmetrically, for example such that an increase in attenuation (i.e. "turning down") may occur faster than the opposite decrease (i.e. "turning back up"), which may lead to superior processing of certain genres of signals.

The Threshold (106) could be specified on an absolute scale, such as dBFS. Alternatively, the threshold level is specified relative (e.g. in dB) to a given reference level, or relative to a measured overall (loudness) level of the signal itself. The actual threshold may be pre-determined according to published regulations or recommendations, or it may be determined according to the preference of the listener or a producer.

An RMS level detector may be considered a (very) primitive loudness level estimator. In order to improve the accuracy of the loudness estimate, the input signal may be pre-processed, prior to the Sliding-window detector. The Preprocessor block (300) shown in FIG. 3, preferably contains a frequency weighting related to loudness perception, implemented in a filter such as the standardized A-, C-, or K-weighting filters. Furthermore, the Preprocessor may contain a function to "down-mix" multiple input channels in the proper domain.

In a more advanced embodiment of the disclosure, the preprocessor may comprise loudness models containing multi-band processing. For instance, the signal could be analyzed in terms of octave-bands, ⅓-octave bands, or "critical bands" known from psychoacoustic models, for instance, as gammatone filters. However, note that for some applications of the loudness limiter, the estimate of loudness should be as accurate as possible, whereas in other applications, it may be more important that the loudness estimation method complies with certain specifications.

As the preprocessor (300) and sliding window detector (200) together perform a measurement of loudness level, the limiting function (signal attenuation) performed by the present disclosure corresponds to a 'limiting' of the perceptual property, loudness.

Figure 3:
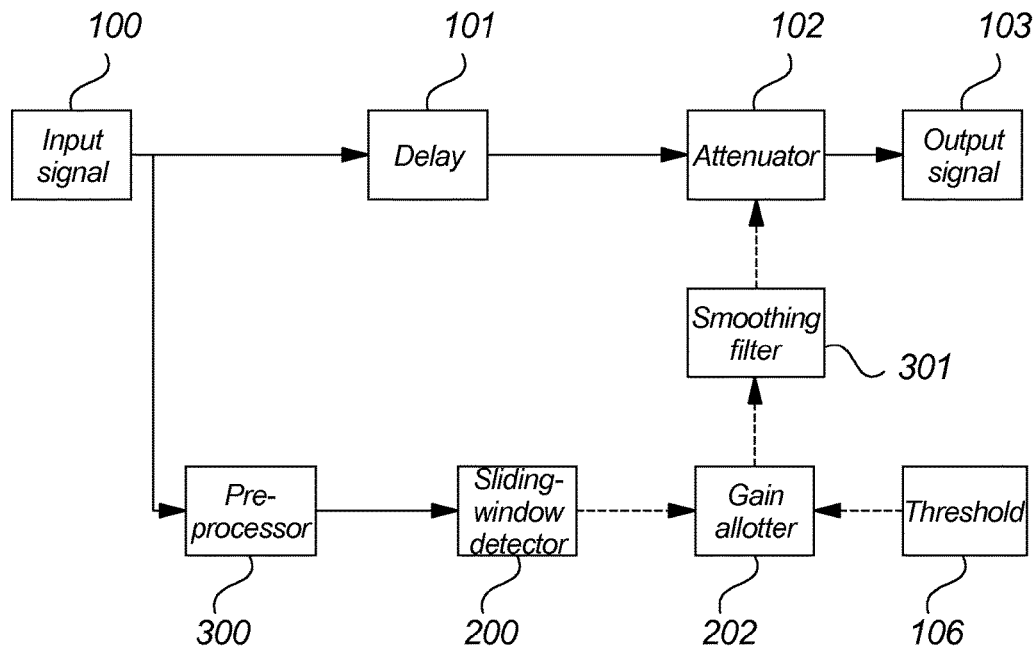
FIG. 3 shows a preferred embodiment of the disclosure, comprising optional Preprocessor block and optional Smoothing filter block.

Embodiments of the present disclosure may optionally apply a Smoothing filter (301), such as a low-pass filter, to the time-varying attenuation gain, as shown in FIG. 3. Thereby abrupt changes of the gain value that may occur, especially when operating at short time-scales, can be prevented from causing distortion of the output signal. It may be advantageous to employ an FIR filter as Smoothing filter, as an IIR filter might in some cases impede the brick-wall limiting.

According to the present disclosure the required attenuation gain is calculated directly, by means of feed-forward topology. Hence, it does not suffer from the "successive approximation" and overshoot issues of processors based on a feedback topology. The present disclosure can apply exactly the required amount of gain attenuation needed to comply with a certain requirement.

Figure 4:
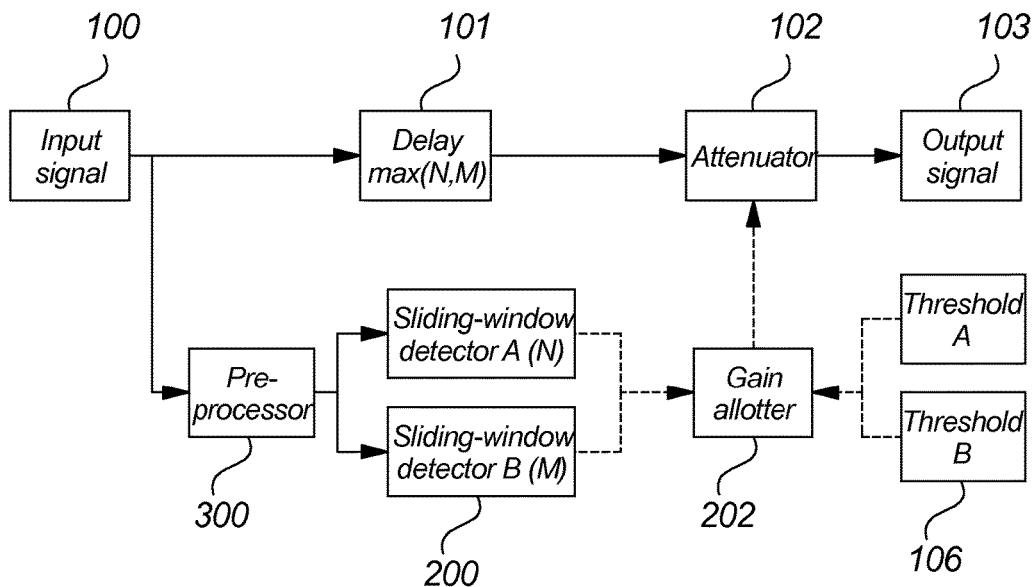
FIG. 4 shows a preferred embodiment of the disclosure: Multiple sliding-window detectors (A,B) with individual window-lengths (N,M) and Thresholds. The preprocessor (optional) may be shared by the detectors.

In a further embodiment, the loudness estimate may be computed at two or more specified time-scales, such that the desired maximum loudness of a "short sound" and of a "longer sound" may be specified individually and independently. FIG. 4 shows a block diagram of an embodiment of the disclosure containing two Sliding-window detectors (200), with window-lengths N and M, respectively. The loudness limiting property is enabled by delaying the audio signal, to be attenuated, corresponding to the longest of the windows, i.e. max(N,M).

It may furthermore be desirable for the loudness limiting on multiple time-scales to be calculated according to an individual threshold (106) per time-scale. This is shown in FIG. 4, for the 2 time-scales A and B.

In some applications the maximum level of the output signal may be specified and assessed with a measurement method based on a recursive (IIR) filter. In order to provide an output loudness limiting embodiment of the present disclosure complying with such requirements, an FIR-type level detector (200) could be designed as a truncated IIR filter. A Sliding-window detector may in an embodiment implement a truncated IIR filter by applying an FIR low-pass filter, whose impulse response is similar to the "target" IIR filter but with a finite order.

Alternatively, for such applications that have to comply with specifications referring to IIR filters, the level detector of a loudness limiter according to the present disclosure could comprise an actual IIR filter, typically corresponding to the one specified for assessing the resulting output level. Note that this configuration would still produce a feed-forward control flow within the loudness limiter, as the IIR filter in the level detector would measure the level before the gain attenuation block (102), not after.

Note that due to the recursive nature of IIR filters, the length of the delay (101) would in this case be determined by other criteria than the order of the filter(s) in the level detector (as was the case with the FIR-type output level assessment). Moreover, a Gain allotter function that would take into account the recursive integration of an IIR-based level detector might be preferable to the more conservative maximum function used in the example.

An example embodiment of the disclosure described in detail

The following provides further details of one example of an embodiment of the disclosure, such as shown in FIG. 2 and FIG. 3.

Window-length: N
Number of input channels: 2 (i.e left, right)
Preprocessor Block (300):

$$\text{PreprocessedInput}(n) = \sqrt{\text{Input}(n,\text{left})^2 + \text{Input}(n,\text{right})^2}$$

Sliding-Window Detector Block (200):

$$\text{Level}(n) = \sqrt{\frac{1}{N} \sum_{k=0}^{N-1} \text{PreProcessedInput}(n-k)^2}$$

Gain Allotter Block (202):

$$\text{LevelMax}(n) = \max_{k=0}^{N-1} \text{Level}(n-k)$$

$$\text{Gain}(n) = \begin{cases} \frac{\text{Treshold}}{\text{LevelMax}(n)} & \text{if } \text{LevelMax}(n) > \text{Threshold} \\ 1 & \text{otherwise} \end{cases}$$

Delay Block (101):
$$\text{DelayedInput}(n) = \text{Input}(n-(N-1))$$

Attenuator Block (102):
$$\text{Output}(n) = \text{DelayedInput}(n) \cdot \text{Gain}(n)$$

Note: Delay and Attenuator operate on all audio channels.

Alternative Embodiments of the Disclosure

Figure 5:
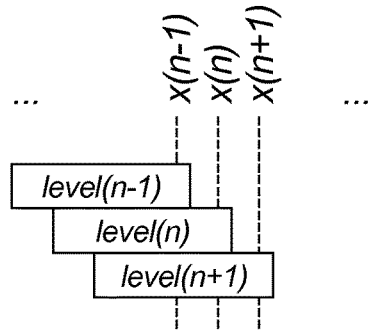
FIG. 5a shows input samples related to a simple Sliding-window detector, according to an embodiment of the disclosure.
FIG. 5b shows input samples related to a Sliding-window detector partitioned into 3 blocks, according to an embodiment of the disclosure.
FIG. 5c shows input samples related to a Sliding-window detector with 2 different simultaneous window-lengths, according to an embodiment of the disclosure.
Figure 5:
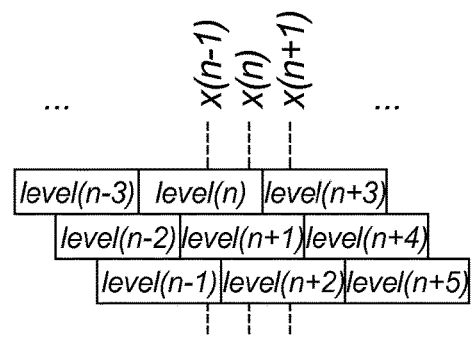
Figure 5:
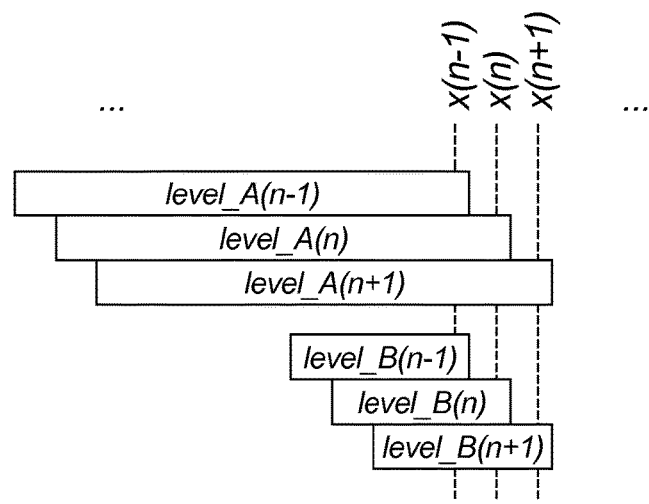
Figure 6:
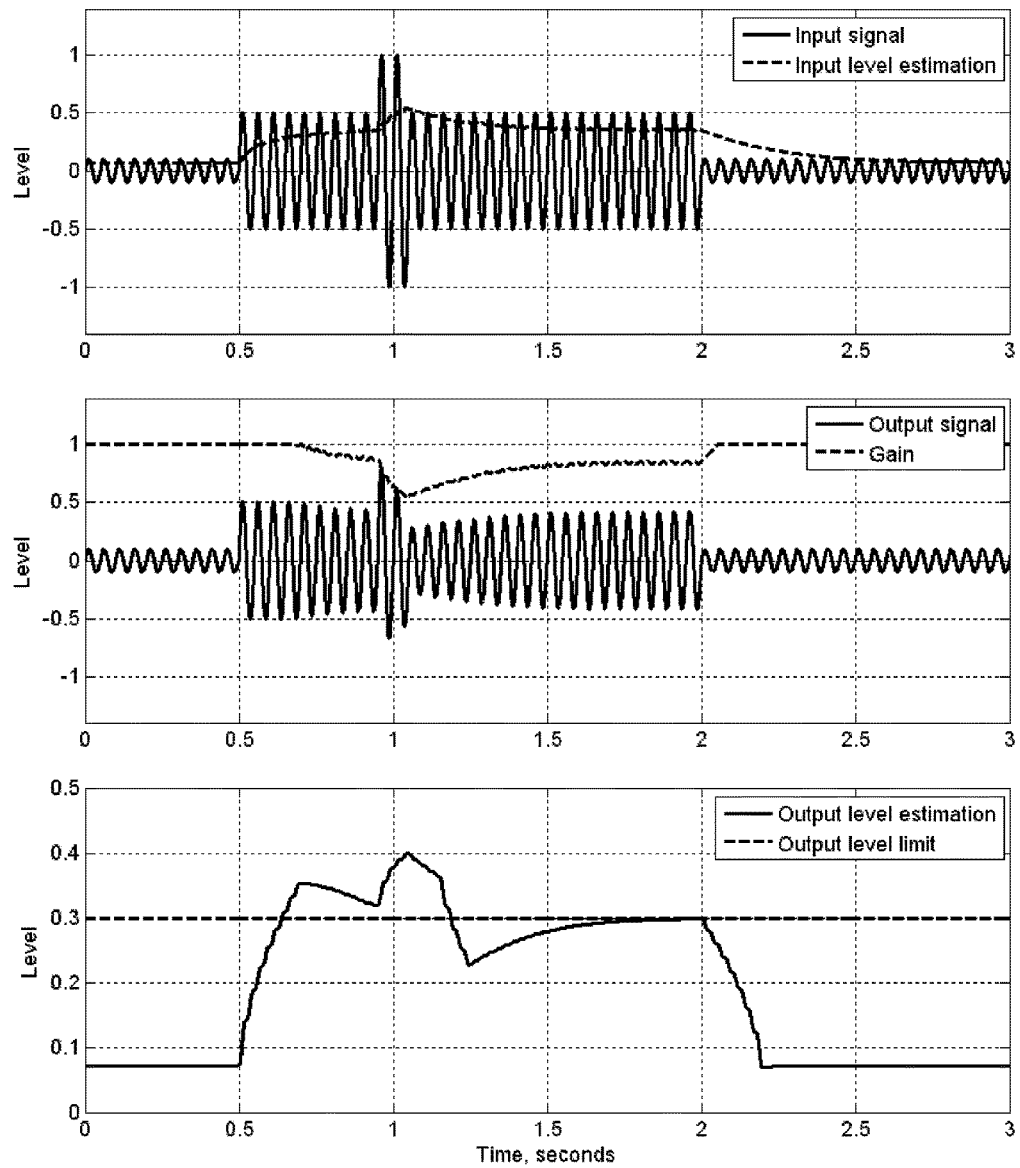
FIGS. 6-10 show plots according to prior art processors.
Figure 7:
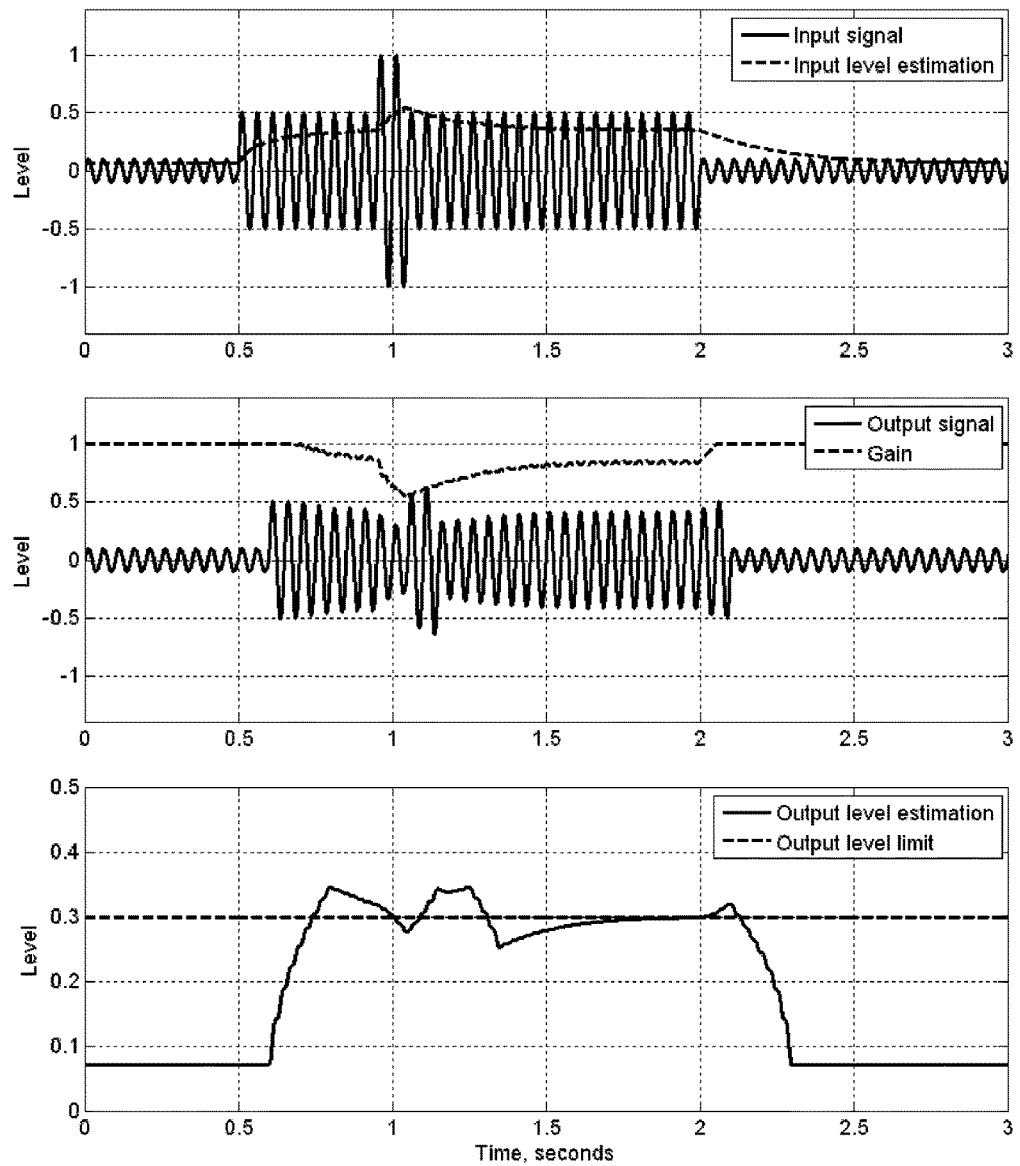
Figure 8:
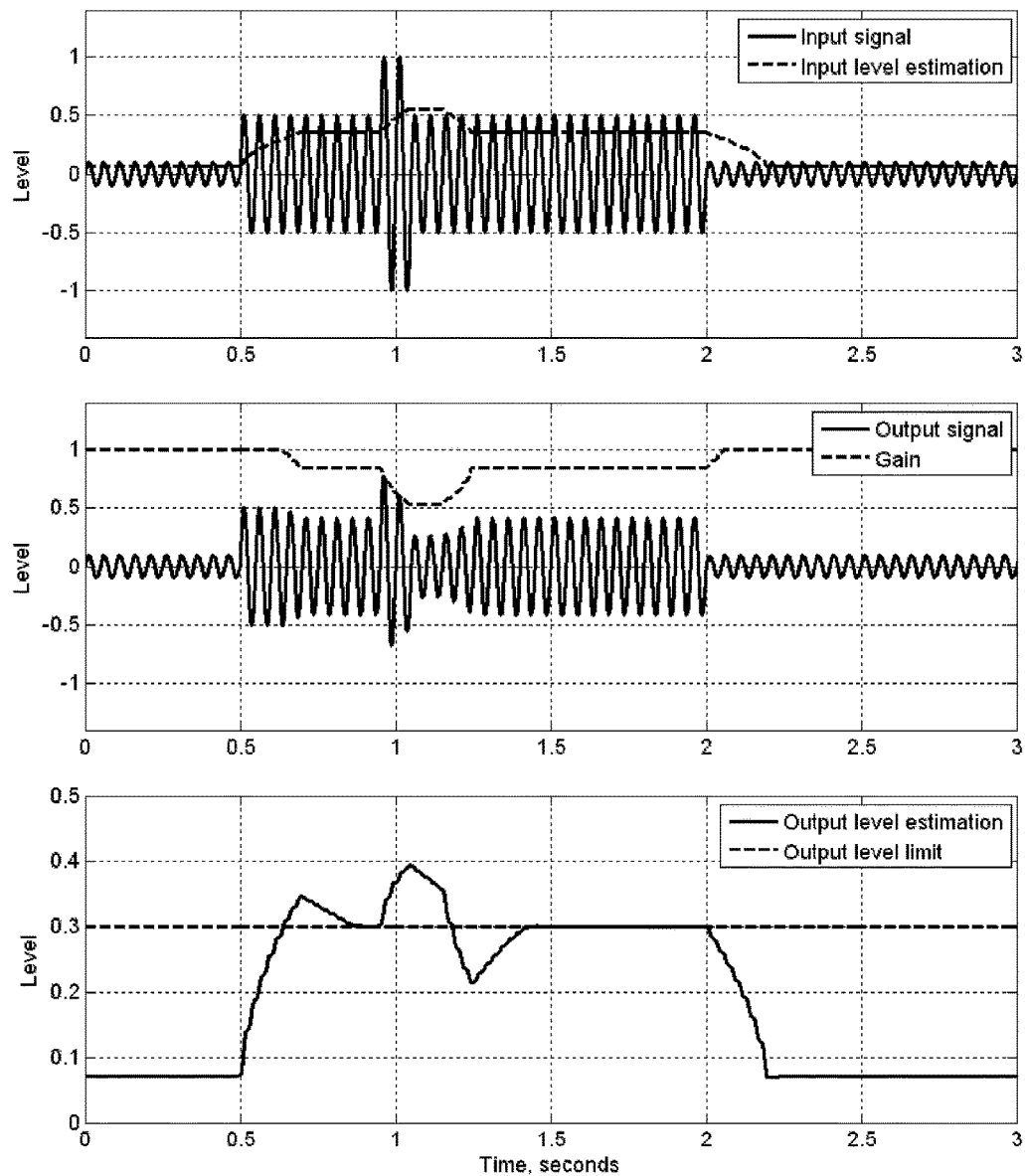
Figure 9:
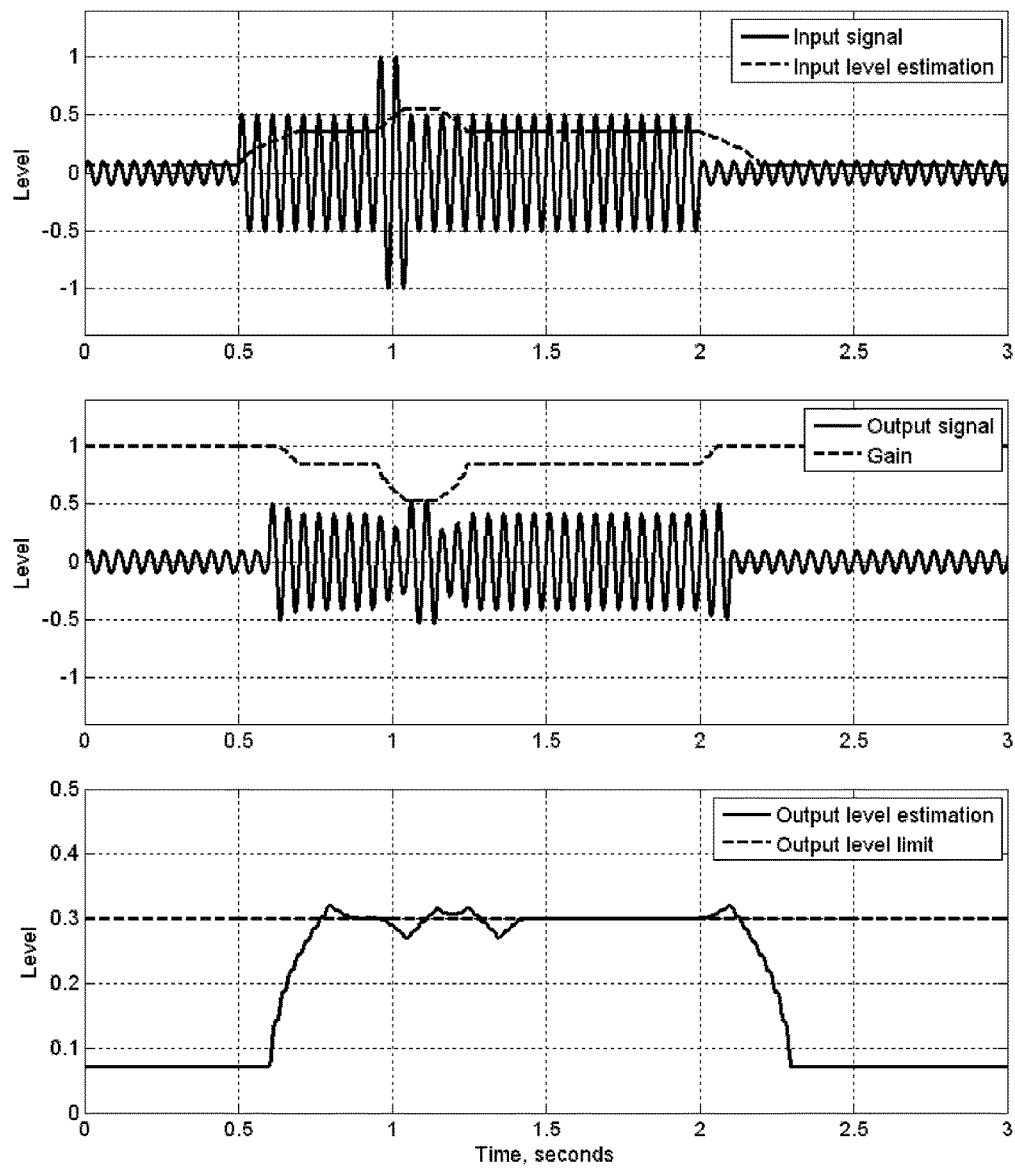
Figure 10:
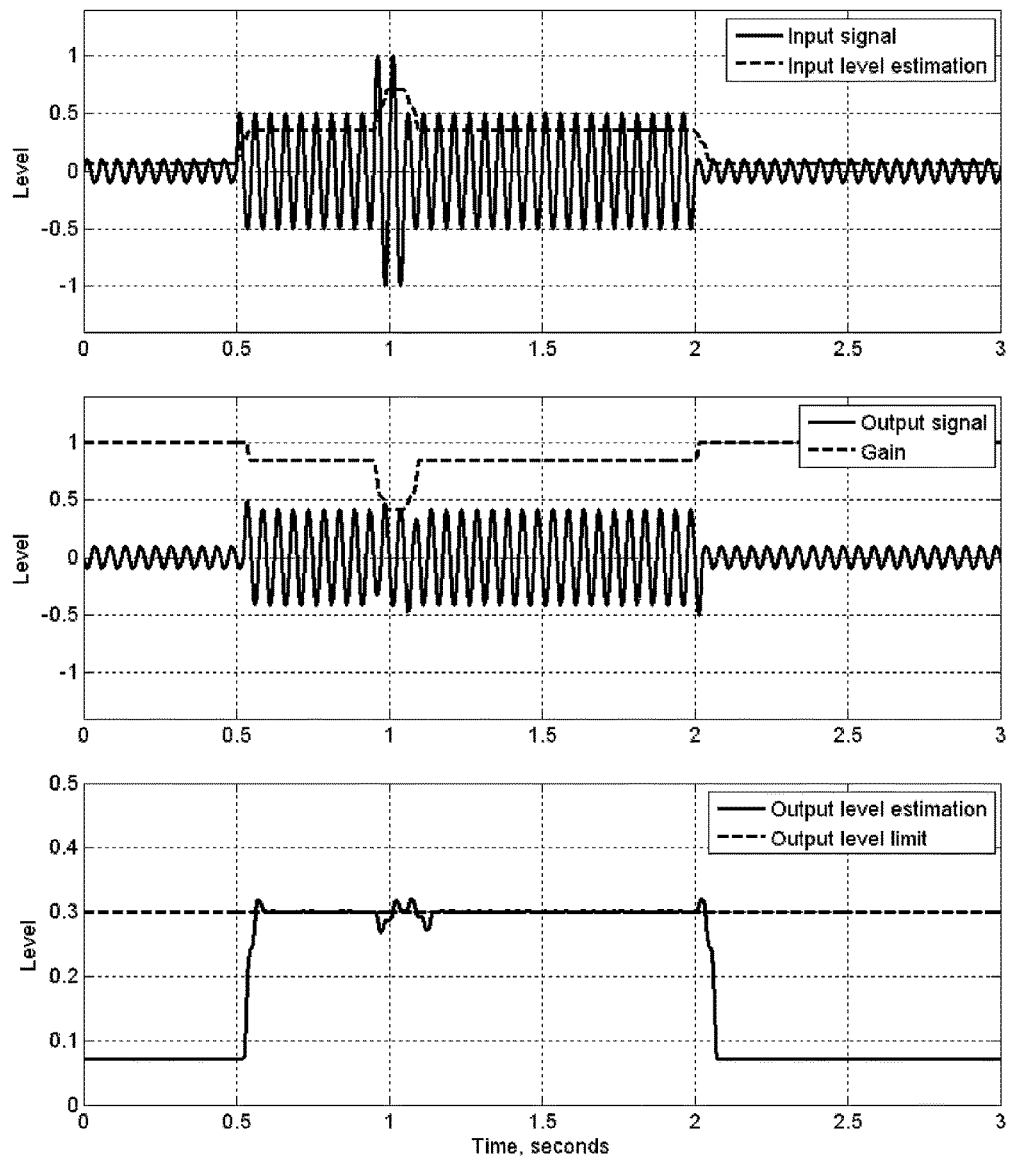

FIG. 5a-5c illustrate the case above (5a), and also cases where the Sliding-window detector is partitioned into blocks (5b), and where multiple Sliding-window detectors, with different lengths and thresholds, are employed (5c).

Case 5a)
As the Gain Allotter above described above.

Case 5b)
An embodiment where the sliding-window of the Detector is partitioned into B partition blocks. In this case, N/B is substituted for N in the description above.

Case 5c)
An embodiment where 2 simultaneous sliding-window Detectors, A and B, have window-lengths, N and M, respectively. In this case:

Sliding-window Detector block (200):

$$\text{Level\_A}(n) = \sqrt{\frac{1}{N} \sum_{k=0}^{N-1} \text{PreProcessedInput}(n-k)^2}$$

$$\text{Level\_B}(n) = \sqrt{\frac{1}{M} \sum_{k=0}^{M-1} \text{PreProcessedInput}(n-k)^2}$$

Gain Allotter block (202):

$$\text{LevelMax\_A}(n) = \max_{k=0}^{N-1} \text{Level\_A}(n-k)$$

$$\text{LevelMax\_B}(n) = \max_{k=0}^{M-1} \text{Level\_B}(n-k)$$

$$\text{Gain\_A}(n) = \begin{cases} \dfrac{\text{Threshold\_A}}{\text{LevelMax\_A}(n)} & \text{if LevelMax\_A}(n) > \text{Threshold\_A} \\ 1 & \text{otherwise} \end{cases}$$

$$\text{Gain\_B}(n) = \begin{cases} \dfrac{\text{Threshold\_B}}{\text{LevelMax\_B}(n)} & \text{if LevelMax\_B}(n) > \text{Threshold\_B} \\ 1 & \text{otherwise} \end{cases}$$

$$\text{Gain}(n) = \min(\text{Gain\_A}(n), \text{Gain\_B}(n))$$

Delay block (101):

$$\text{DelayedInput}(n) = \text{Input}(n - (\max(N,M)-1))$$

Note: In case 5c the respective "step size" of the multiple Sliding-window Detectors may need to be the same, however partition blocks of the sliding windows (if any) would not necessarily need to be aligned.

Plots illustrating results of prior art processors and embodiments of the disclosure To demonstrate the effect of the present disclosure compared to prior art processors, a set of experiments have been conducted under comparable circumstances and the results are shown in comparable plots in FIG. 6-14. The experiments have been performed by simulation.

The upper plot for each experiment illustrates:
An Input signal illustrating a time-domain waveform plot of the (mono) input audio signal. The input signal is the same in all the experiments and is composed of a tone with 3 levels, such that a longer sound requires some attenuation, with the given threshold, and a shorter sound requires further attenuation.
An Input level estimation=the level of the input signal, as measured by the particular level detector according to the prior art processor or embodiment of the disclosure being tested (IIR, FIR, or sliding-window detector).

The middle plot for each experiment illustrates:
An Output signal illustrating a time-domain waveform plot of the (mono) output audio signal as being output from the attenuator (102).
A Gain illustrating a time-varying attenuation gain, as calculated by the Gain Control block (in experiments on prior art processors) or Gain Allotter block (in experiments on embodiments of the present disclosure).

The bottom plot for each experiment illustrates:
An Output level estimation illustrating the "measured" loudness level of the output signal; note that this level is measured on the Output signal subsequently to and independent from any processing performed by the particular signal processor being tested. The "measurement" is performed by means of a sliding, finite-length RMS-window in the experiments of FIG. 6-12, and by an IIR integration filter in the experiments of FIG. 13-14.
An Output level limit indicating the given threshold loudness level (0.3 was used in the experiments)

On the bottom plot, for each processor, the estimated output level can be compared to the threshold (i.e., output level limit), for example to determine whether the tested processor manages to "brick wall" limit the output loudness, or allows small or big overshoots.

In the summary of the experiments below, the following abbreviations are used:
IIR=Infinite impulse-response filter;
FIR=Finite impulse-response filter; and
LAD=Look-ahead time delay.

FIG. 6-10 show plots of experiments with 5 different prior art processors, with either IIR- or FIR-based Level Detectors, and with or without Look-ahead Delay:
Experiment of FIG. 6: IIR as Level Detector (104), without LAD (101);
Experiment of FIG. 7: IIR as Level Detector (104), with LAD (101);
Experiment of FIG. 8: FIR as Level Detector (104), without LAD (101);
Experiment of FIG. 9: FIR as Level Detector (104), with LAD (101); and
Experiment of FIG. 10: FIR with small window length as Level Detector (104), with LAD (101).

FIGS. 6-10 demonstrate that none of the tested prior art processors manages to effectively limit the loudness level such that it stays below the threshold. The prior art processors all attenuate the signal to some degree, when it is above the threshold, but none of them achieves the "brick-wall limiting" made possible by preferred embodiments of the present disclosure.

Figure 11:
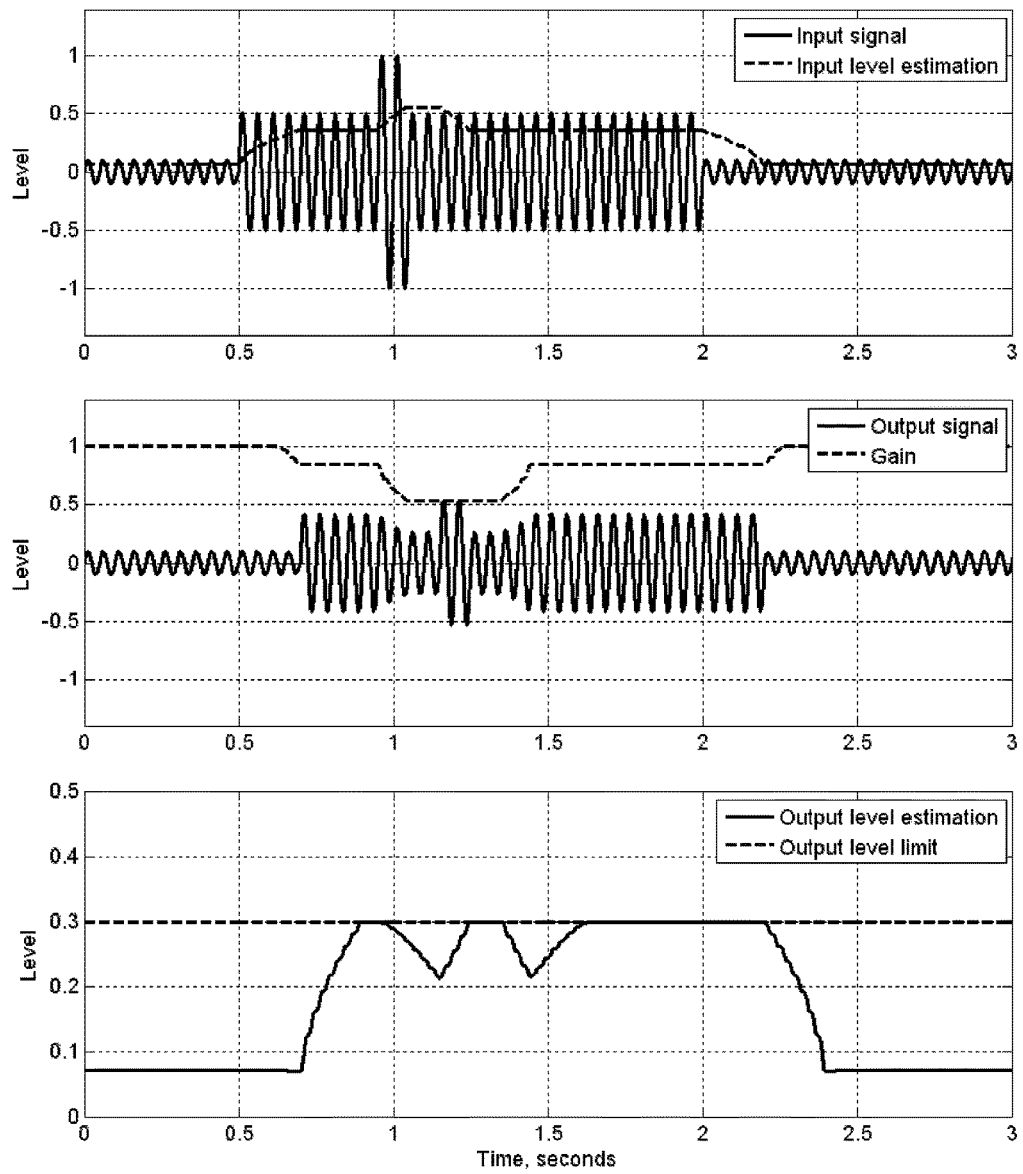
FIG. 11 shows a plot according to an embodiment of the present disclosure.
Figure 12:
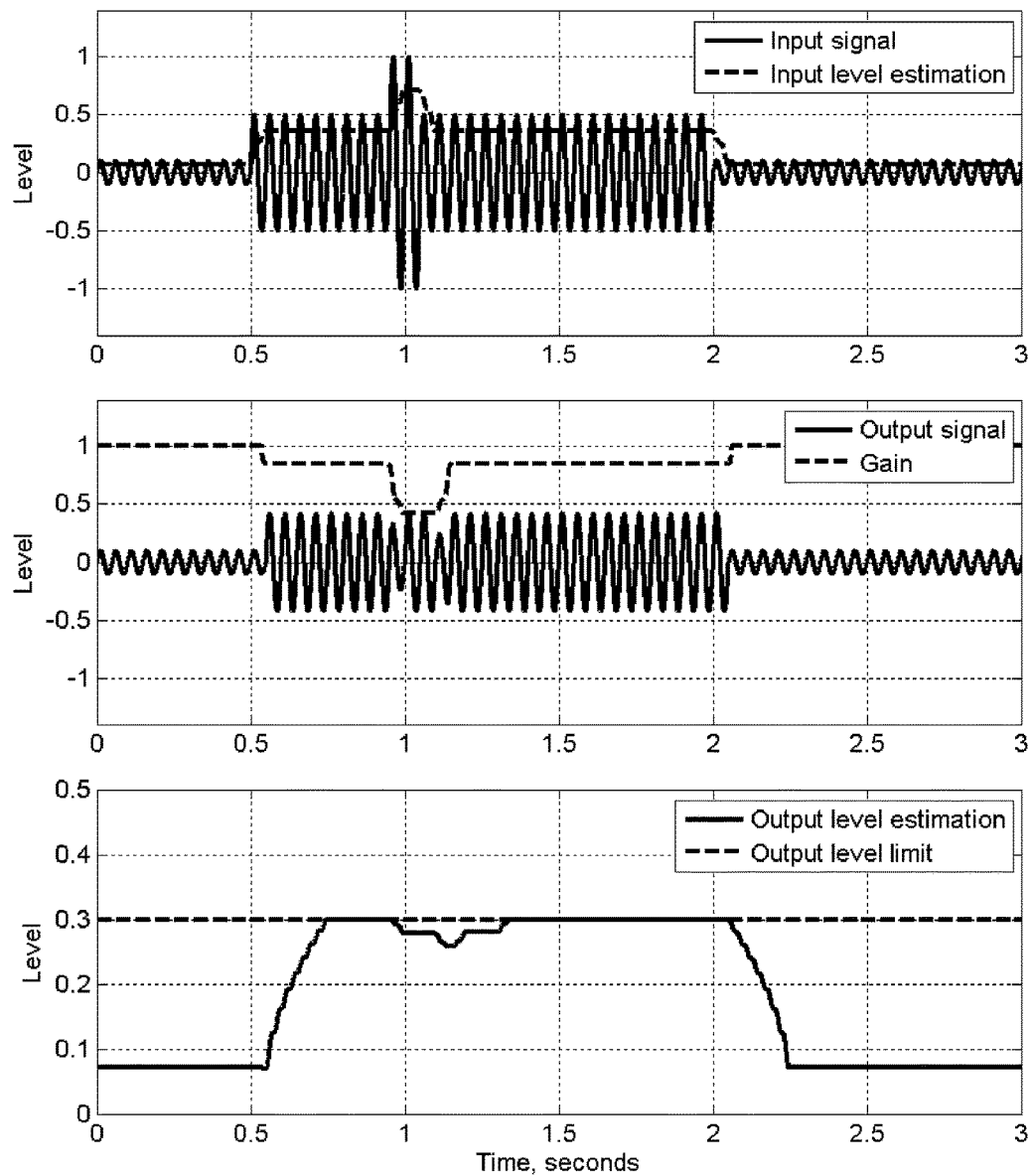
FIG. 12 shows a plot according to another embodiment of the present disclosure.

FIG. 11-12 show plots of experiments with two embodiments of the present disclosure, both based with FIR-based analysis and Look-ahead Delay:
Experiment of FIG. 11: Embodiment of the disclosure, utilizing FIR in Sliding-window detector (200), with LAD (101); and
Experiment of FIG. 12: Embodiment of the disclosure, utilizing FIR in
Sliding-window detector (200) and the analysis window being partitioned into 4 blocks, and with LAD (101).

As demonstrated in FIGS. 11 and 12, embodiments of the present disclosure manage to apply "brick wall" limiting, where the output level never exceeds the threshold.

Figure 13:
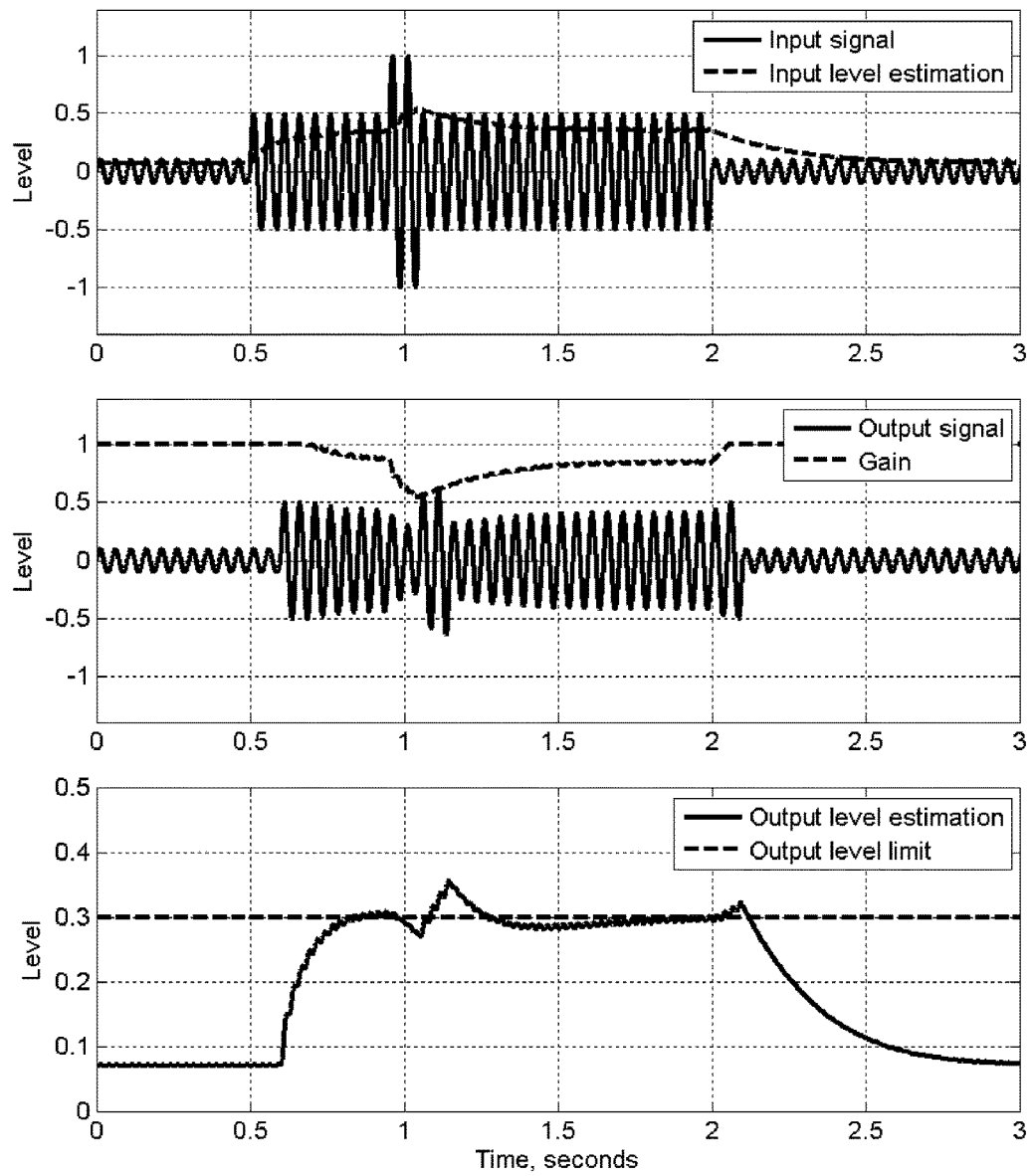
FIG. 13 shows a plot according to prior art wherein the resulting output level is measured with an IIR integration filter.
Figure 14:
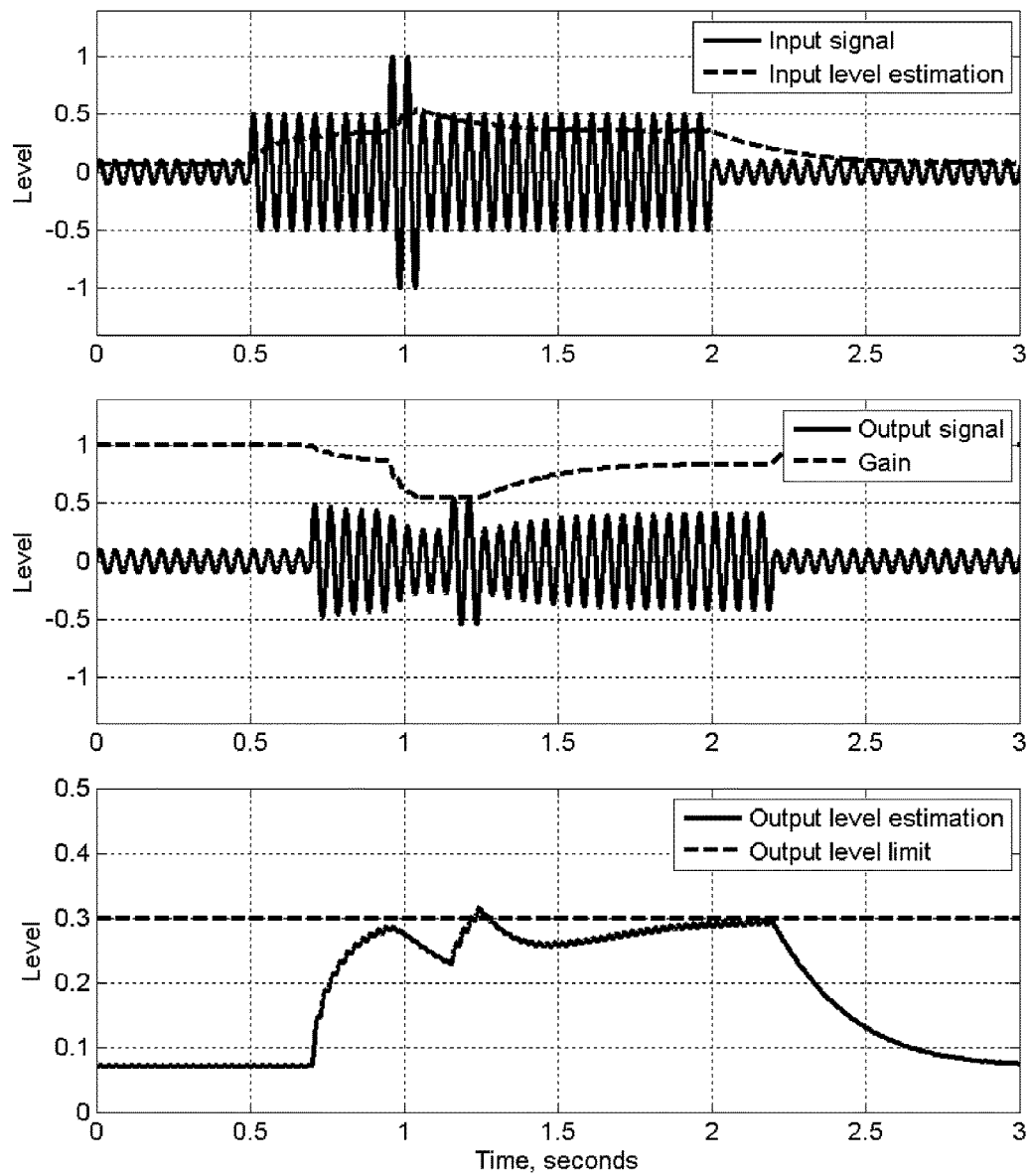
FIG. 14 shows a plot according to an embodiment of the present disclosure, wherein the resulting output level is measured with an IIR integration filter.

FIGS. 13 and 14 show experiments with a prior art processor and with an embodiment of present disclosure, respectively, for when the resulting output level is measured with an IIR integration filter, for example in applications where the specifications to comply with refer to IIR-filtered output levels. The same IIR filter is employed in the level detector (104) in the experiment of FIG. 13 and in the Sliding-window detector (200) in the experiment of FIG. 14, for the sake of comparison:
Experiment of FIG. 13: Prior art processor, IIR as Level Detector (104), with LAD (101); and
Experiment of FIG. 14: Embodiment of the disclosure, utilizing a FIR-implemented truncated IIR filter in Sliding-window detector (200), with LAD (101).

The results of the IIR-based experiments show, that even when IIR-filtering is required in order to comply with IIR-based specifications and requirements, the present disclosure, due to the Gain Allotter, is able to much better constrain the resulting output level.

An alternative embodiment of the disclosure, having a Level Predictor

Figure 15:
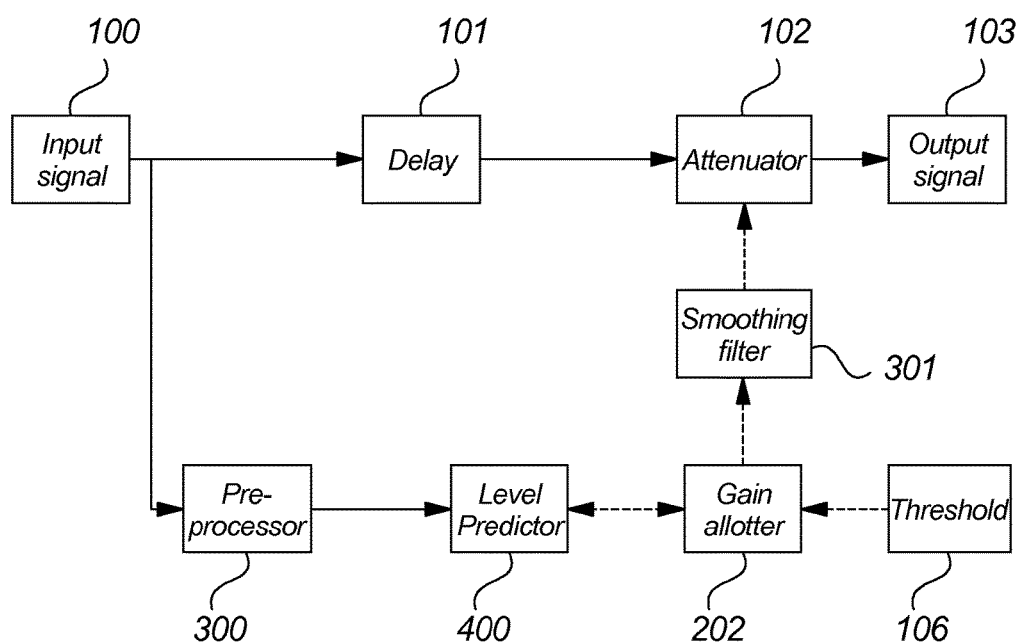
FIG. 15 shows a preferred embodiment of the present disclosure, comprising a Level Predictor along with optional Preprocessor and Smoothing filter blocks.

FIG. 15 illustrates an alternative, preferred embodiment of the disclosure, where a Level Predictor (400) is included to predict the level that a level detector, which could be IIR, FIR or based on any other detector scheme, would measure if coupled to the output signal downstream of the loudness limiter of the present disclosure. The purpose of the Level Detector is to compute an instant gain value to limit the output loudness level to a certain threshold in combination with the Gain allotter.

As an example of an implementation with a first-order IIR level detector, the MS (Mean Square) level is found as follows:

$$p[n]=k1 \cdot x[n]^2+k2 \cdot p[n-1]$$

The RMS value equals the square-root of p[n].

To keep p[n] below a certain limit ($p_{LIM}$) a time-varying gain factor is included. This gain factor is used when the level is predicted to exceed a given limit.

$$p[n]=k1 \cdot (gain[n] \cdot x[n])^2+k2 \cdot p[n-1]$$

To prevent the resulting level exceeding the desired level, the gain factor can be found as:

$$\text{gain}[n] = \sqrt{\frac{p_{LIM} - k2 \cdot p[n-1]}{k1 \cdot x[n]^2}}$$

The following pseudo sample code explains the combined functionality of Level Predictor (400) and Gain allotter (202):

```
p0 = k1*x0*x0 + k2*p1              // predict level
if p0 > plim
   gain = sqrt((plim-k2*p1)/(k1*x0*x0))  // gain that satisfy limit
   p0 = plim                       // state = downstream detector
else
   gain = 1.0                      // no gain reduction
end
p1 = p0                            // update 1st order IIR state
```

The level is predicted by the Level Predictor and if the level exceeds the threshold, an instant gain value (less than 1.0) is computed. At the same time the IIR state is set to the threshold value (which also will be the case for the downstream level detector when the instant gain value affects the output signal).

Figure 17:
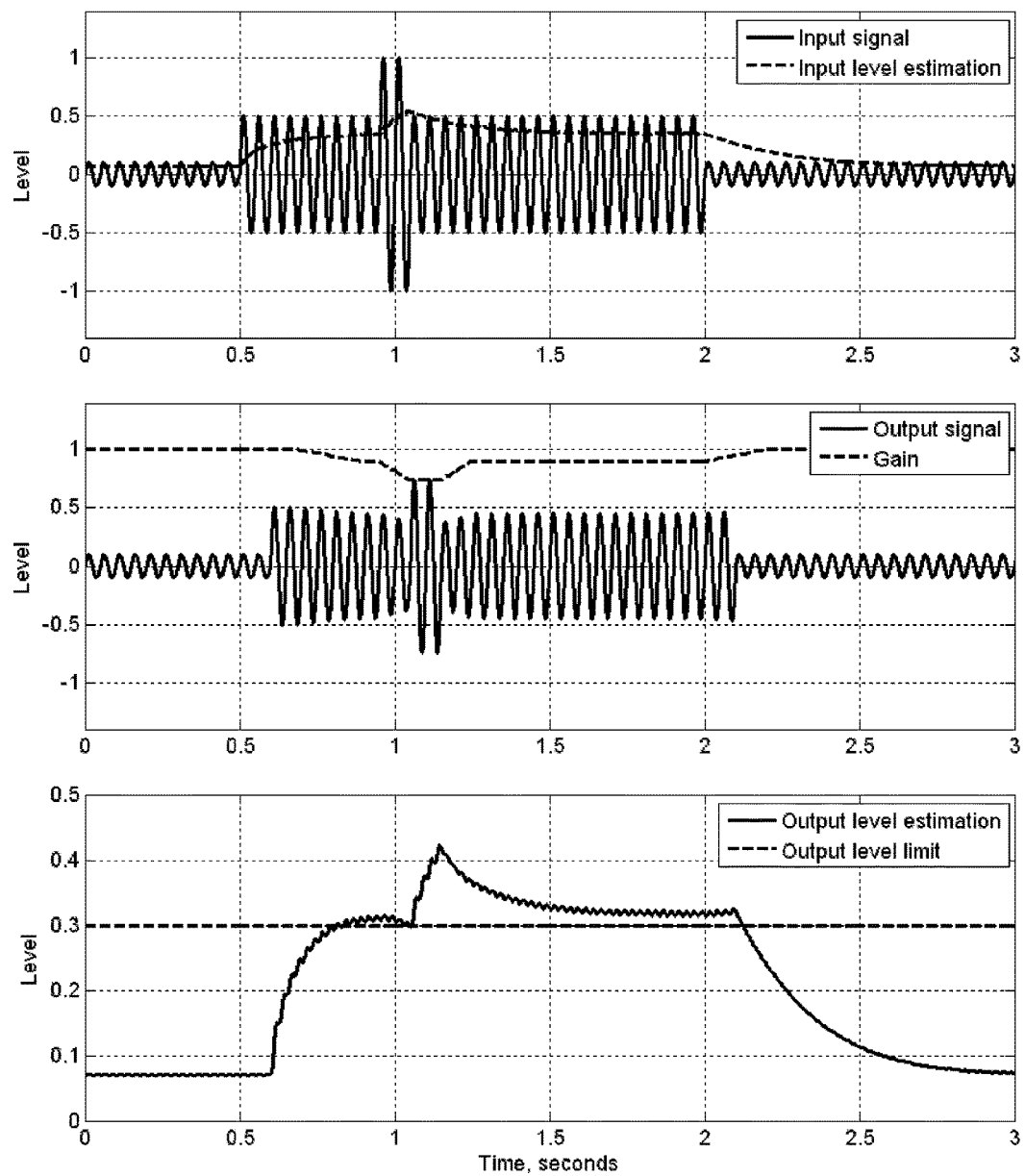
Figure 18:
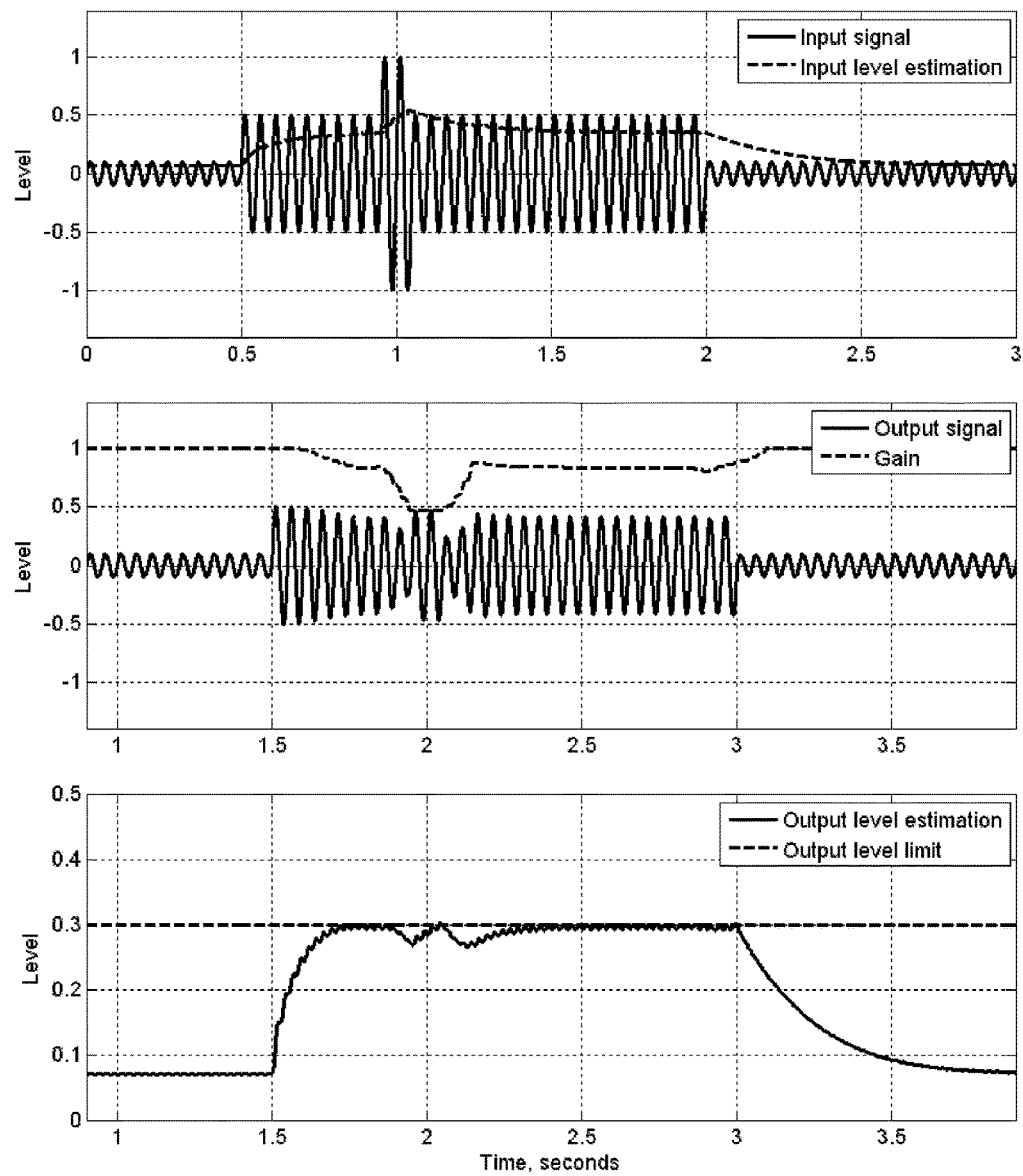

Experiments, in the form of simulations, were also performed on the embodiment described above with reference to FIG. 15. The experiments were conducted under the same circumstances as the experiments described above with reference to FIG. 6-14, and the results are illustrated in similar plots in FIG. 16-18. Remarks to the experiments described above apply to the below, mutatis mutandis. For example, the input signal and the threshold value used for the experiments illustrated in FIG. 16-18 are the same as used in the experiments illustrated in FIG. 6-14.

Figure 16:
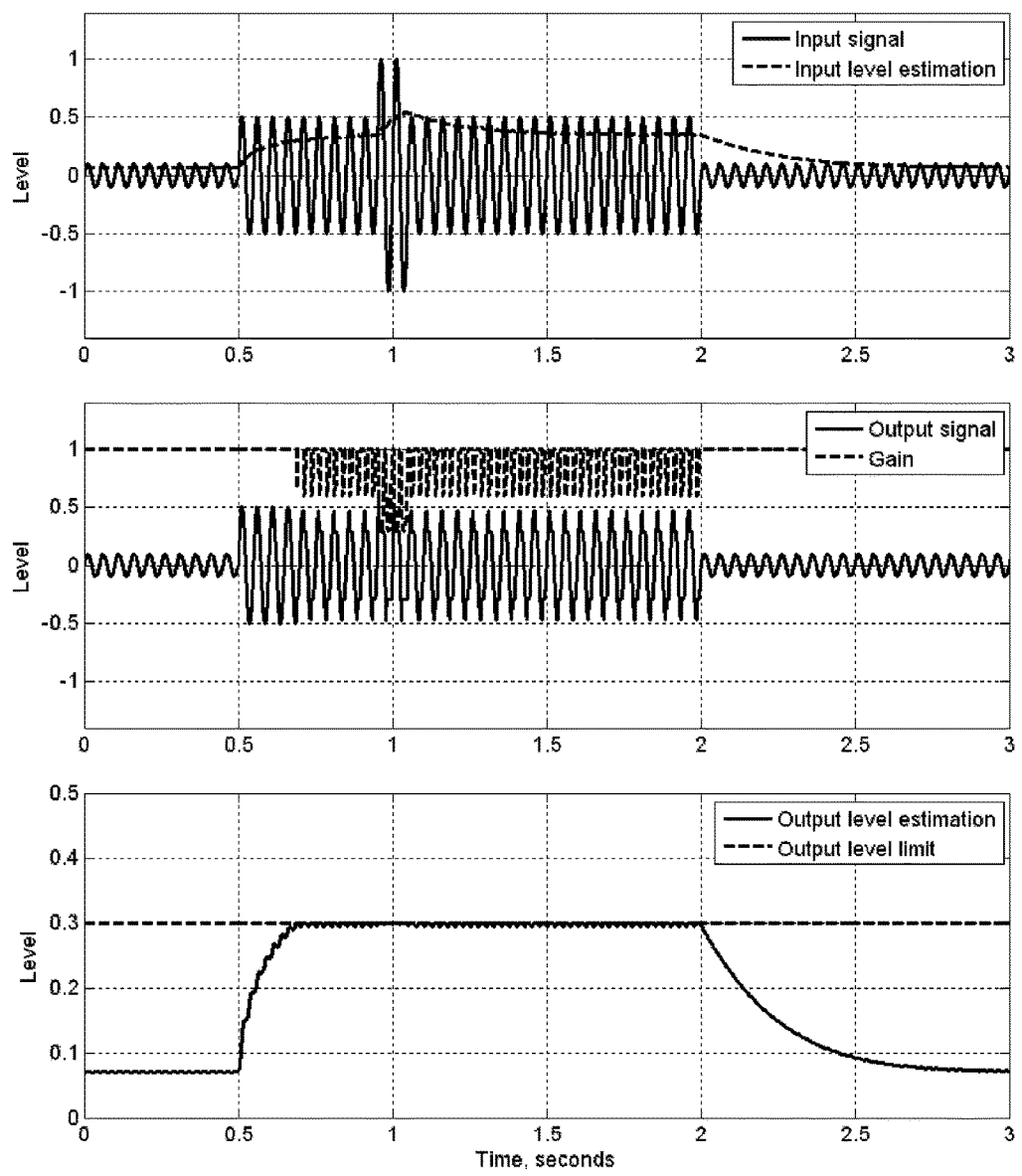
FIGS. 16-18 show plots according to embodiments of the present disclosure.

Experiment of FIG. 16: Embodiment of the disclosure, utilizing IIR in Level Predictor (400), without LAD (101) and Smoothing filter (301).

As it can be observed, the level of the output signal does not exceed the threshold —however the subjective audio quality may be affected by the instant changing gain values.

To improve on that property the delay and smoothing filter may be used:

Experiment of FIG. 17: Embodiment of the disclosure, utilizing IIR in Level Predictor (400), with LAD (101) and running average Smoothing filter (301).

As illustrated the gain is now smeared over time, which decreases the audio quality penalty discussed above but the level is no longer constrained to stay below the desired limit because of the time smearing effect.

One way to overcome this issue is to arrange the loudness limiter as a cascade of N algorithms of the type shown in FIG. 15. Each algorithm will attenuate the gain, meaning that the resulting system will converge (as function of number of algorithms in the cascade) towards a combined limiter that will stay below the desired threshold. An experiment with an embodiment of the disclosure having 10 algorithms in cascade of the type described with reference to FIG. 15 is shown in FIG. 18:

Experiment of FIG. 18: Preferred embodiment of the disclosure, with 10 algorithms in cascade of the type used for the experiment illustrated in FIG. 17.

Several different embodiments, variations and optional parts of the disclosure have been described above. To avoid unnecessary complication not all possible combinations of features, variations and optional parts have been explicitly stated.

Nevertheless, it should be noted that any combination of embodiments or of an embodiment with a feature described in relation to another embodiment, or with other suitable variations are within the scope of the present disclosure, even if the combination is not explicitly described in the above.

The invention claimed is:

1. A loudness limiting method for attenuating an input audio signal having an initial loudness level in order to constrain a resulting loudness level of an output audio signal by a pre-determined threshold loudness level, the loudness limiting method including the following steps:

receiving the input audio signal comprising a sequence of input signal values by a loudness signal processor;

the loudness signal processor determining a time-varying level of said input audio signal by means of a finite-length sliding window, the time-varying level comprising time-varying level values each based on an individual time interval of a multiple of said input signal values;

the loudness signal processor calculating a time-varying attenuation gain on the basis of said time-varying level of said input audio signal and said pre-determined threshold loudness level;

the loudness signal processor time-delaying said input audio signal;

the loudness signal processor applying said time-varying attenuation gain to said time-delayed input audio signal by applying an individual attenuation gain value to a corresponding individual input signal value resulting in said output audio signal having a constrained loudness level, wherein said individual attenuation gain value is based on at least two of said time-varying level values for which said individual time interval comprises said corresponding individual input signal value; and providing said output audio signal having the constrained loudness level from the loudness signal processor, such that an estimated loudness level of the output audio signal substantially never exceeds said pre-determined threshold loudness level.

2. The loudness limiting method according to claim 1, wherein said calculating a time-varying attenuation gain comprises repetitively calculating an individual attenuation gain value based on several time-varying level values of said determined time-varying level of said input audio signal, said several time-varying level values being determined for different times of said time-varying level of said input audio signal.

3. The loudness limiting method according to claim 1, wherein an individual attenuation gain value is associated with a specific time of said input audio signal, and wherein several time-varying level values forming basis for the individual attenuation gain value comprise substantially all time-varying level values determined where an input signal value for said specific time of said input audio signal is within said finite-length sliding window.

4. The loudness limiting method according to claim 1, wherein, when determining each of several time-varying level values forming basis for an individual attenuation gain value associated with a specific time of said input audio signal, the finite-length sliding window includes an input signal value for said specific time of said input audio signal.

5. The loudness limiting method according to claim 1, wherein different times, for which the several time-varying level values forming basis for said individual attenuation gain value are determined, are within a time interval corresponding to a length of said finite-length sliding window.

6. The loudness limiting method according to claim 1, wherein an individual attenuation gain value of said time-varying attenuation gain is based on a part of said input audio signal, the length of said part corresponding to substantially twice the length of the finite-length sliding window.

7. The loudness limiting method according to claim 1, wherein the determining the time-varying level of said input audio signal comprises estimating a time-varying loudness level of said input audio signal.

8. The loudness limiting method according to claim 1, wherein an estimated loudness level over a single finite-length window of the output audio signal substantially never exceeds said pre-determined threshold loudness level.

9. The loudness limiting method according to claim 1, wherein the finite-length sliding window is partitioned into blocks, and said time-varying attenuation gain is calculated based on the partition blocks of said finite-length sliding window.

10. The loudness limiting method according to claim 1, wherein the finite-length sliding window is partitioned such that each window consists of exactly one partition block.

11. The loudness limiting method according to claim 1, wherein the finite-length sliding window is partitioned such that each window consists of two or more partition blocks, and the time-varying attenuation gain is distributed according to relative levels of the two or more partition blocks within each window.

12. The loudness limiting method according to claim 1, wherein the time-varying attenuation gain is distributed in proportion to relative levels of partition blocks within each finite-length sliding window.

13. The loudness limiting method according to claim 1, wherein multiple window-lengths are employed simultaneously, by applying a time-varying attenuation gain that is calculated based on a combination of partition blocks, from the different windows, corresponding to the same input sample(s), such that said estimated loudness level of the output signal is limited at multiple time-scales simultaneously.

14. The loudness limiting method according to claim 1, operating at multiple simultaneous time-scales, and each time-scale comprising an individual threshold loudness level.

15. The loudness limiting method according to claim 1, wherein said determining said time-varying level of said input audio signal comprises an RMS calculation of the input audio signal.

16. The loudness limiting method according to claim 1, wherein said determining said time-varying level of said input audio signal is based on a filtering related to a measurement filtering according to specifications for the use of the output signal.

17. The loudness limiting method according to claim 1, wherein said determining said time-varying level of said input audio signal is based on a recursive filter.

18. The loudness limiting method according to claim 1, wherein said input audio signal is received from the output of a dynamic-range compressor.

19. The loudness limiting method according to claim 1, comprising a step of pre-processing said input audio signal prior to said determining said time-varying level of said input audio signal.

20. The loudness limiting method according to claim 19, wherein said pre-processing comprises frequency weighting.

21. The loudness limiting method according to claim 19, wherein said pre-processing comprises applying an A-weighting or C-weighting filter.

22. The loudness limiting method according to claim 19, wherein said pre-processing comprises applying a K-weighting filter.

23. The loudness limiting method according to claim 19, wherein said pre-processing comprises a channel weighting.

24. The loudness limiting method according to claim 23, wherein said channel weighting comprises a per-sample power domain sum of channels of said input audio signal.

25. The loudness limiting method according to claim 23, wherein said channel weighting comprises a gain matrix containing a gain coefficient for each individual channel of the input audio signal.

26. The loudness limiting method according to claim 19, wherein said pre-processing comprises a level normalization of the input signal.

27. The loudness limiting method according to claim 1, comprising a step of smoothing said time-varying attenuation gain, such that abrupt changes of said attenuation gain would not cause distortion of the output audio signal.

28. The loudness limiting method according to claim 1, wherein a length of said finite-length sliding window is between 200 ms and 3 s.

29. The loudness limiting method according to claim 1, wherein said individual gain values are not greater than unity.

30. A loudness signal processor for attenuating an input audio signal in order to constrain a resulting loudness level of an output audio signal by a pre-determined threshold loudness level, the loudness signal processor comprising an input audio signal having an initial loudness level, the input audio signal comprising a sequence of input signal values;

a level detector arranged to determine a time-varying level of said input audio signal by means of a finite-length sliding window, the time-varying level comprising time-varying level values each based on an individual time interval of multiple of said input signal values;

a gain allotter arranged to calculate a time-varying attenuation gain on the basis of said time-varying level of said input audio signal and said pre-determined threshold loudness level;

a time-delay arranged to delay the input audio signal;

an attenuator arranged to apply said time-varying attenuation gain to the delayed input audio signal by applying an individual attenuation gain value to a corresponding individual input signal value, resulting in said output audio signal, wherein said individual attenuation gain value is based on at least two of said time-varying level values for which said individual time interval comprises said corresponding individual input signal value.

31. The loudness signal processor according to claim 30, wherein said level detector comprises a sliding-window detector.

32. The loudness signal processor according to claim 30, wherein said time-varying attenuation gain comprises a plurality of individual attenuation gain values, an attenuation gain value being based on several time-varying level values of said determined time-varying level of said input audio signal, said several time-varying level values being determined for different times of said time-varying level of said input audio signal.

33. The loudness signal processor according to claim 30, wherein said time-varying attenuation gain comprises a plurality of individual attenuation gain values, wherein an individual attenuation gain value is associated with a specific time of said input audio signal, and wherein the several time-varying level values forming basis for the individual attenuation gain value comprises substantially all time-varying level values determined where an input signal value for said specific time of said input audio signal is within said finite-length sliding window.

34. The loudness signal processor according to claim 30, wherein, when determining each of several time-varying level values forming basis for an individual attenuation gain value associated with a specific time of said input audio signal, the finite-length sliding window includes an input signal value for said specific time of said input audio signal.

35. The loudness signal processor according to claim 30, wherein different times, for which several time-varying level values forming basis for said individual attenuation gain value are determined, are within a time interval corresponding to a length of said finite-length sliding window.

36. The loudness signal processor according to claim 30, wherein an individual attenuation gain value of said time-varying attenuation gain is based on a part of said input audio signal, the length of said part corresponding to substantially twice the length of the finite-length sliding window.

37. The loudness signal processor according to claim 30, wherein the time-varying level of said input audio signal corresponds to an estimate of a time-varying loudness level of said input audio signal.

38. The loudness signal processor according to claim 30, wherein an estimated loudness level over a single finite-length window of the output audio signal substantially never exceeds said pre-determined threshold loudness level.

39. The loudness signal processor according to claim 30, wherein the finite-length sliding window is partitioned into blocks, and said gain allotter is arranged to calculate said time-varying attenuation gain based on the partition blocks of said finite-length sliding window.

40. The loudness signal processor according to claim 30, wherein the finite-length sliding window is partitioned such that each window consists of exactly one partition block.

41. The loudness signal processor according to claim 30, wherein the finite-length sliding window is partitioned such that each window consists of two or more partition blocks, and the gain allotter is arranged to distribute the time-varying attenuation gain according to relative levels of the two or more partition blocks within each window.

42. The loudness signal processor according to claim 30, wherein the gain allotter is arranged to distribute the time-varying attenuation gain in proportion to relative levels of partition blocks within each finite-length sliding window.

43. The loudness signal processor according to claim 30, wherein the loudness signal processor is arranged to employ multiple window-lengths simultaneously, by applying a time-varying attenuation gain that is calculated based on a combination of partition blocks, from the different windows, corresponding to the same input sample(s), such that said estimated loudness level of the output signal is limited at multiple time-scales simultaneously.

44. The loudness signal processor according to claim 30, arranged to employ multiple simultaneous time-scales, each time-scale comprising an individual threshold loudness level.

45. The loudness signal processor according to claim 30, wherein said level detector is arranged to determine said time-varying level of said input audio signal by performing RMS calculation of the input audio signal.

46. The loudness signal processor according to claim 30, comprising a preprocessor arranged to preprocess said input audio signal prior to said level detector.

47. The loudness signal processor according to claim 46, wherein said preprocessor comprises frequency weighting.

48. The loudness signal processor according to claim 46, wherein said preprocessor comprises an A-weighting or C-weighting filter.

49. The loudness signal processor according to claim 46, wherein said preprocessor comprises a K-weighting filter.

50. The loudness signal processor according to claim 46, wherein said pre-processor comprises channel weighting.

51. The loudness signal processor according to claim 50, wherein said channel weighting comprises a per-sample power domain sum of channels of said input audio signal.

52. The loudness signal processor according to claim 50, wherein said channel weighting comprises a gain matrix containing a gain coefficient for each individual channel of the input audio signal.

53. The loudness signal processor according to claim 30, comprising smoothing filter arranged to smooth said time-varying attenuation gain such that abrupt changes of said attenuation gain would not cause distortion of the output audio signal.

54. A non-transitory, computer-readable storage medium storing instructions to execute a loudness limiting method, the instructions when executed by a processor of a loudness signal processing apparatus causes the loudness signal processing apparatus to perform steps of attenuating an input audio signal comprising a sequence of input signal values in order to constrain a resulting loudness level of an output audio signal by a pre-determined threshold loudness level; the loudness limiting method of said audio signal processing program including the following steps:

determining a time-varying level of said input audio signal by means of a finite-length sliding window, the time-varying level comprising time-varying level values each based on an individual time interval of multiple of said input signal values;

calculating a time-varying attenuation gain on the basis of said time-varying level of said input audio signal and said pre-determined threshold loudness level;

time-delaying said input audio signal; and applying said time-varying attenuation gain to said time-delayed input audio signal by applying an individual attenuation gain value to a corresponding individual input signal value resulting in said output audio signal, wherein said individual attenuation gain value is based on at least two of said time-varying level values for which said individual time interval comprises said corresponding individual input signal value.

55. A loudness limiting method for attenuating an input audio signal in order to constrain a resulting loudness level of an output audio signal by a pre-determined threshold loudness level, the loudness limiting method including the following steps:
  receiving the input audio signal comprising a sequence of input signal values by a loudness signal processor;
  the loudness signal processor determining a time-varying level of said input audio signal by determining a plurality of time-varying level values each based on multiple of said input signal values, the time-varying level representing a loudness;
  the loudness signal processor calculating a time-varying attenuation gain of which an individual attenuation gain value for a corresponding individual input signal value is based on a non-linear function of at least two of said plurality of time-varying level values of said input audio signal and said pre-determined threshold loudness level, wherein all of said at least two of said plurality of time-varying level values are based on said corresponding individual input signal value;
  the loudness signal processor time-delaying said input audio signal;
  the loudness signal processor applying said time-varying attenuation gain to said time-delayed input audio signal by applying an individual attenuation gain value to said corresponding individual input signal value resulting in said output audio signal; and
  providing said output audio signal from said loudness signal processor, such that an estimated loudness level of the output audio signal substantially never exceeds said pre-determined threshold loudness level.

56. The loudness limiting method according to claim 55, wherein said time-delay is at least 200 ms.

57. A loudness limiting method for attenuating an input audio signal in order to constrain a resulting loudness level of an output audio signal by a pre-determined threshold loudness level, the loudness limiting method including the following steps:
  receiving the input audio signal by a loudness signal processor;
  the loudness signal processor calculating a time-varying level on the basis of said input audio signal, the calculated time-varying level comprising a time-varying predicted level of an output signal, the time-varying level representing a loudness;
  the loudness signal processor calculating a time-varying attenuation gain on the basis of said time-varying level and said pre-determined threshold loudness level;
  the loudness signal processor time-delaying said input audio signal;
  the loudness signal processor applying said time-varying attenuation gain to said time-delayed input audio signal resulting in said output audio signal, wherein said time-varying attenuation gain is based on a level of said input signal and said time-varying predicted level of said output signal, as well as said pre-determined threshold loudness level; and
  providing said output audio signal from said loudness signal processor, such that an estimated loudness level of the output audio signal substantially never exceeds said pre-determined threshold loudness level.

58. The loudness limiting method according to claim 57, wherein said calculating a time-varying attenuation gain comprises repetitively calculating an individual attenuation gain value based on a plurality of time-varying level values of said calculated time-varying level.

59. The loudness limiting method according to claim 57, wherein said calculating a time-varying attenuation gain is based on a level of said input signal and said time-varying predicted level of said output signal, as well as said pre-determined threshold loudness level.

60. The loudness limiting method according to claim 57, wherein said time-varying predicted level of said output audio signal is based on a level of said input signal and a representation of past levels of said output audio signal.

61. The loudness limiting method according to claim 60, wherein said representation of past levels of said output audio signal is a state of an IIR filter, and wherein said state is updated in relation to said calculated time-varying attenuation gain.

62. The loudness limiting method according to claim 57, wherein the steps of calculating a time-varying level and calculating a time-varying attenuation gain are iterated to optimize the calculated time-varying attenuation gain.

63. The loudness limiting method according to claim 57, wherein said time-delay is at least 200 ms.

\* \* \* \* \*